(12) United States Patent
Wu et al.

(10) Patent No.: US 11,217,546 B2
(45) Date of Patent: Jan. 4, 2022

(54) EMBEDDED VOLTAGE REGULATOR STRUCTURE AND METHOD FORMING SAME

(71) Applicant: Taiwan Semiconductor Manufacturing Company, Ltd., Hsinchu (TW)

(72) Inventors: Jiun Yi Wu, Zhongli (TW); Chen-Hua Yu, Hsinchu (TW); Chien-Hsun Chen, Zhutian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/458,948

(22) Filed: Jul. 1, 2019

(65) Prior Publication Data
US 2020/0194393 A1 Jun. 18, 2020

Related U.S. Application Data

(60) Provisional application No. 62/779,857, filed on Dec. 14, 2018.

(51) Int. Cl.
*H01L 23/31* (2006.01)
*H01L 23/00* (2006.01)
*H01L 21/56* (2006.01)

(52) U.S. Cl.
CPC ............ *H01L 24/09* (2013.01); *H01L 21/561* (2013.01); *H01L 21/563* (2013.01);
(Continued)

(58) Field of Classification Search
CPC ... H01L 24/97; H01L 25/105; H01L 25/0652; H01L 25/18; H01L 25/16;
(Continued)

(56) References Cited

U.S. PATENT DOCUMENTS 8,361,842 B2 1/2013 Yu et al.
8,598,854 B2 12/2013 Soenen et al.
(Continued)

FOREIGN PATENT DOCUMENTS

CN 102456636 A 5/2012
CN 102934227 A 2/2013
(Continued)

*Primary Examiner* — Selim U Ahmed
*Assistant Examiner* — Evan G Clinton
(74) *Attorney, Agent, or Firm* — Slater Matsil, LLP

(57) ABSTRACT

A method includes attaching a voltage regulator to a first redistribution structure of a first package. A second redistribution structure is formed over the voltage regulator, the voltage regulator being embedded in the second redistribution structure. The first substrate is attached to the second redistribution structure to form a second package including the first package. A first voltage may be provided to the second redistribution structure and through the second redistribution structure to the voltage regulator. The voltage regulator regulates the first voltage into a second voltage and provides the second voltage through the first redistribution structure to a first device die, where an output of the voltage regulator is attached directly to the first redistribution structure.

20 Claims, 30 Drawing Sheets

(52) U.S. Cl.
CPC ...... *H01L 23/3121* (2013.01); *H01L 23/3135* (2013.01); *H01L 24/17* (2013.01); *H01L 24/81* (2013.01); *H01L 24/97* (2013.01); *H01L 2224/0231* (2013.01); *H01L 2224/02331* (2013.01); *H01L 2924/1427* (2013.01); *H01L 2924/37001* (2013.01)

(58) Field of Classification Search
CPC .......... H01L 2221/68345; H01L 2221/68359; H01L 2221/68368; H01L 21/6835; H01L 21/568
See application file for complete search history.

(56) References Cited

U.S. PATENT DOCUMENTS

| | | | |
|---|---|---|---|
| 8,629,694 | B1 | 1/2014 | Wang et al. |
| 8,629,706 | B2 | 1/2014 | Chen et al. |
| 8,680,647 | B2 | 3/2014 | Yu et al. |
| 8,703,542 | B2 | 4/2014 | Lin et al. |
| 8,759,964 | B2 | 6/2014 | Pu et al. |
| 8,778,738 | B1 | 7/2014 | Lin et al. |
| 8,785,299 | B2 | 7/2014 | Mao et al. |
| 8,803,306 | B1 | 8/2014 | Yu et al. |
| 8,809,996 | B2 | 8/2014 | Chen et al. |
| 8,816,670 | B2 | 8/2014 | Lee et al. |
| 8,829,676 | B2 | 9/2014 | Yu et al. |
| 8,877,554 | B2 | 11/2014 | Tsai et al. |
| 10,446,523 | B2 * | 10/2019 | Marimuthu ........... H01L 25/105 |
| 2007/0013080 | A1 | 1/2007 | DiBene et al. |
| 2011/0291288 | A1 | 12/2011 | Wu et al. |
| 2012/0126763 | A1 | 5/2012 | Yang |
| 2012/0176186 | A1 | 7/2012 | Chen et al. |
| 2013/0026468 | A1 | 1/2013 | Yoshimuta et al. |
| 2013/0062760 | A1 | 3/2013 | Hung et al. |
| 2013/0062761 | A1 | 3/2013 | Lin et al. |
| 2013/0168848 | A1 | 7/2013 | Lin et al. |
| 2013/0241510 | A1 | 9/2013 | Shi et al. |
| 2013/0307140 | A1 | 11/2013 | Huang et al. |
| 2013/0307516 | A1 | 11/2013 | Horng et al. |
| 2013/0320944 | A1 | 12/2013 | Siao |
| 2014/0002041 | A1 | 1/2014 | Soenen et al. |
| 2014/0203429 | A1 | 7/2014 | Yu et al. |
| 2014/0225222 | A1 | 8/2014 | Yu et al. |
| 2014/0252646 | A1 | 9/2014 | Hung et al. |
| 2014/0264930 | A1 | 9/2014 | Yu et al. |
| 2014/0266114 | A1 | 9/2014 | Chern et al. |
| 2015/0132893 | A1 | 5/2015 | Chan et al. |
| 2015/0235952 | A1 | 8/2015 | Pan et al. |
| 2016/0035590 | A1 * | 2/2016 | Jin .................... H01L 23/49827 257/668 |
| 2017/0263518 | A1 | 9/2017 | Yu et al. |
| 2018/0082988 | A1 | 3/2018 | Cheng et al. |
| 2018/0323150 | A1 * | 11/2018 | Yu .......................... H01L 21/565 |
| 2020/0043853 | A1 * | 2/2020 | Kim .................... H01L 21/565 |
| 2021/0098434 | A1 | 4/2021 | Cheng et al. |

FOREIGN PATENT DOCUMENTS

| | | |
|---|---|---|
| CN | 103839899 A | 6/2014 |
| CN | 107833864 A | 3/2018 |
| KR | 20180030755 A | 3/2018 |

* cited by examiner

EMBEDDED VOLTAGE REGULATOR STRUCTURE AND METHOD FORMING SAME

PRIORITY CLAIM AND CROSS-REFERENCE

This application claims the benefit of U.S. Provisional Application No. 62/779,857, filed on Dec. 14, 2018, which application is hereby incorporated herein by reference.

BACKGROUND

In integrated circuits, some circuit components such as System-On-Chip (SOC) dies and Central Processing Units (CPU) have high requirements to input/output (IO) and power consumption. For example, a CPU may include a plurality of cores, and needs to consume a considerable amount of power. On the other hand, the requirement to the provided power is also high. For example, the power supply voltages need to be very stable, and the voltage drop from the voltage sources to the user device needs to be low. Especially, High Performance Computing (HPC) has become more popular and widely used in advanced networking and server applications, especially for Artificial Intelligence (AI) related products due to requiring increasing data rates and bandwidth and lowering latency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
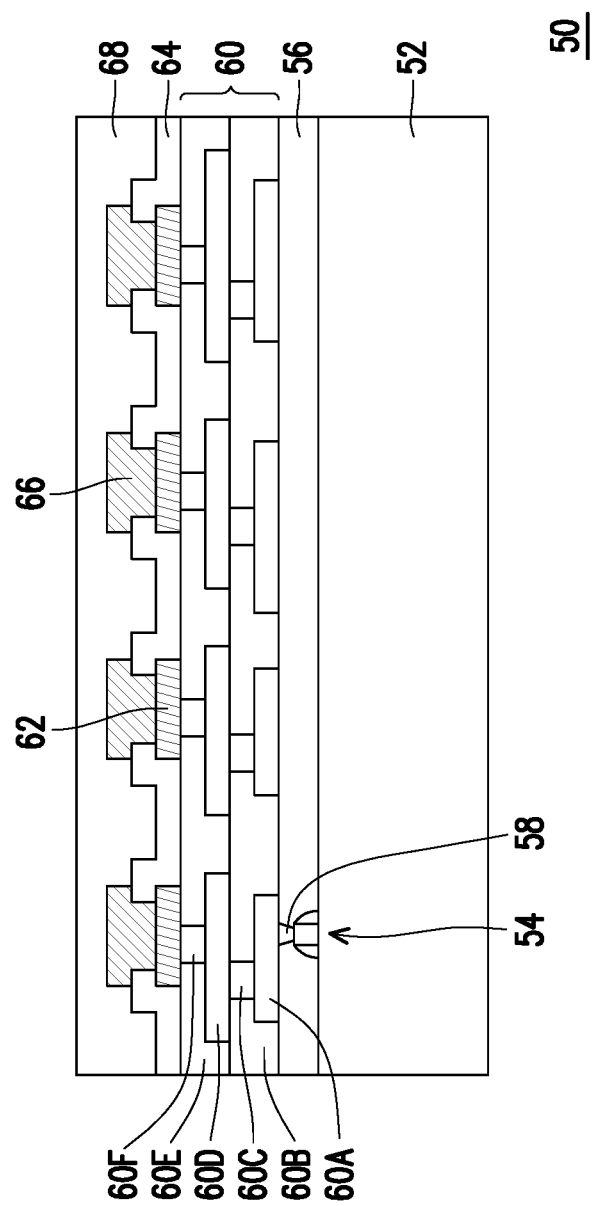
FIG. 1 illustrates a cross-sectional view of an integrated circuit die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an embedded integrated voltage regulator (IVR) is provided for use with an integrated fan out (InFO) package to provide high current to an embedded device die. By embedding the voltage regulator, the output of the voltage regulator may be physically closer to the device die and as such will suffer from less voltage drop (or "IR drop") due to resistances between the voltage regulator and the device die. As semiconductor technologies continue to shrink in more advanced technological nodes, semiconductors have become increasingly sensitive to variations in supply voltage. Placing an IVR closer to the device die provides less IR drop between the output of the IVR and power input of the device die.

FIG. 1 illustrates a cross-sectional view of an integrated circuit die 50 in accordance with some embodiments. The integrated circuit die 50 will be packaged in subsequent processing to form an integrated circuit package. The integrated circuit die 50 may be a logic die (e.g., central processing unit (CPU), graphics processing unit (GPU), system-on-a-chip (SoC), application processor (AP), microcontroller, etc.), a memory die or cube of memory dies (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side.

Devices 54 may be formed at the front surface of the semiconductor substrate 52. The devices 54 may be active devices (e.g., transistors, diodes, etc.), capacitors, resistors, etc. An inter-layer dielectric (ILD) 56 is over the front surface of the semiconductor substrate 52. The ILD 56 surrounds and may cover the devices 54. The ILD 56 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 58 extend through the ILD 56 to electrically and physically couple the devices 54. For example, when the devices 54 are transistors, the conductive plugs 58 may couple the gates and source/drain regions of the transistors. The conductive plugs 58 may be formed of tungsten, cobalt, nickel, copper, silver, gold, aluminum, the like, or combinations thereof. An interconnect structure 60 is over the ILD 56 and conductive plugs 58. The interconnect structure 60 interconnects the devices 54 to form an integrated circuit. The interconnect structure 60 may be formed by, for example, metallization patterns in dielectric layers on the ILD 56. The metallization patterns include metal lines, such as metal lines 60A and metal lines 60D, and vias, such as vias 60C and vias 60F, formed in one or more low-k dielectric layers, such as dielectric layer 60B and dielectric layer 60E. The metallization patterns of the interconnect structure 60 are electrically coupled to the devices 54 by the conductive plugs 58.

The integrated circuit die 50 further includes pads 62, such as aluminum pads, to which external connections are made. The pads 62 are on the active side of the integrated circuit die 50, such as in and/or on the interconnect structure 60. One or more passivation films 64 are on the integrated circuit die 50, such as on portions of the interconnect structure 60 and pads 62. Openings extend through the passivation films 64 to the pads 62. Die connectors 66, such as conductive pillars (for example, formed of a metal such as copper), extend through the openings in the passivation films 64 and are physically and electrically coupled to respective ones of the pads 62. The die connectors 66 may be formed by, for example, plating, or the like. The die connectors 66 electrically couple the respective integrated circuits of the integrated circuit die 50.

Optionally, solder regions (e.g., solder balls or solder bumps) may be disposed on the pads 62. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing are packaged, and dies, which fail the CP testing, are not packaged. After testing, the solder regions may be removed in subsequent processing steps.

A dielectric layer 68 may (or may not) be on the active side of the integrated circuit die 50, such as on the passivation films 64 and the die connectors 66. The dielectric layer 68 laterally encapsulates the die connectors 66, and the dielectric layer 68 is laterally coterminous with the integrated circuit die 50. Initially, the dielectric layer 68 may bury the die connectors 66, such that the topmost surface of the dielectric layer 68 is above the topmost surfaces of the die connectors 66. In some embodiments where solder regions are disposed on the die connectors 66, the dielectric layer 68 may bury the solder regions as well. Alternatively, the solder regions may be removed prior to forming the dielectric layer 68.

The dielectric layer 68 may be a polymer such as polybenzoxazole (PBO), polyimide, benzocyclobutene (BCB), or the like; a nitride such as silicon nitride or the like; an oxide such as silicon oxide, PSG, BSG, BPSG, or the like; the like, or a combination thereof. The dielectric layer 68 may be formed, for example, by spin coating, lamination, chemical vapor deposition (CVD), or the like. In some embodiments, the die connectors 66 are exposed through the dielectric layer 68 during formation of the integrated circuit die 50. In some embodiments, the die connectors 66 remain buried and are exposed during a subsequent process for packaging the integrated circuit die 50. Exposing the die connectors 66 may remove any solder regions that may be present on the die connectors 66.

In some embodiments, the integrated circuit die 50 is a stacked device that includes multiple semiconductor substrates 52. For example, the integrated circuit die 50 may be a memory device such as a hybrid memory cube (HMC) module, a high bandwidth memory (HBM) module, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 60.

FIGS. 2 through 13 illustrate cross-sectional views of intermediate steps during a process for forming a first package component 100, in accordance with some embodiments. A first package region 100A and a second package region 100B are illustrated, and one or more of the integrated circuit dies 50 are packaged to form an integrated circuit package in each of the package regions 100A and 100B. The integrated circuit packages may also be referred to as integrated fan-out (InFO) packages.

Figure 2:
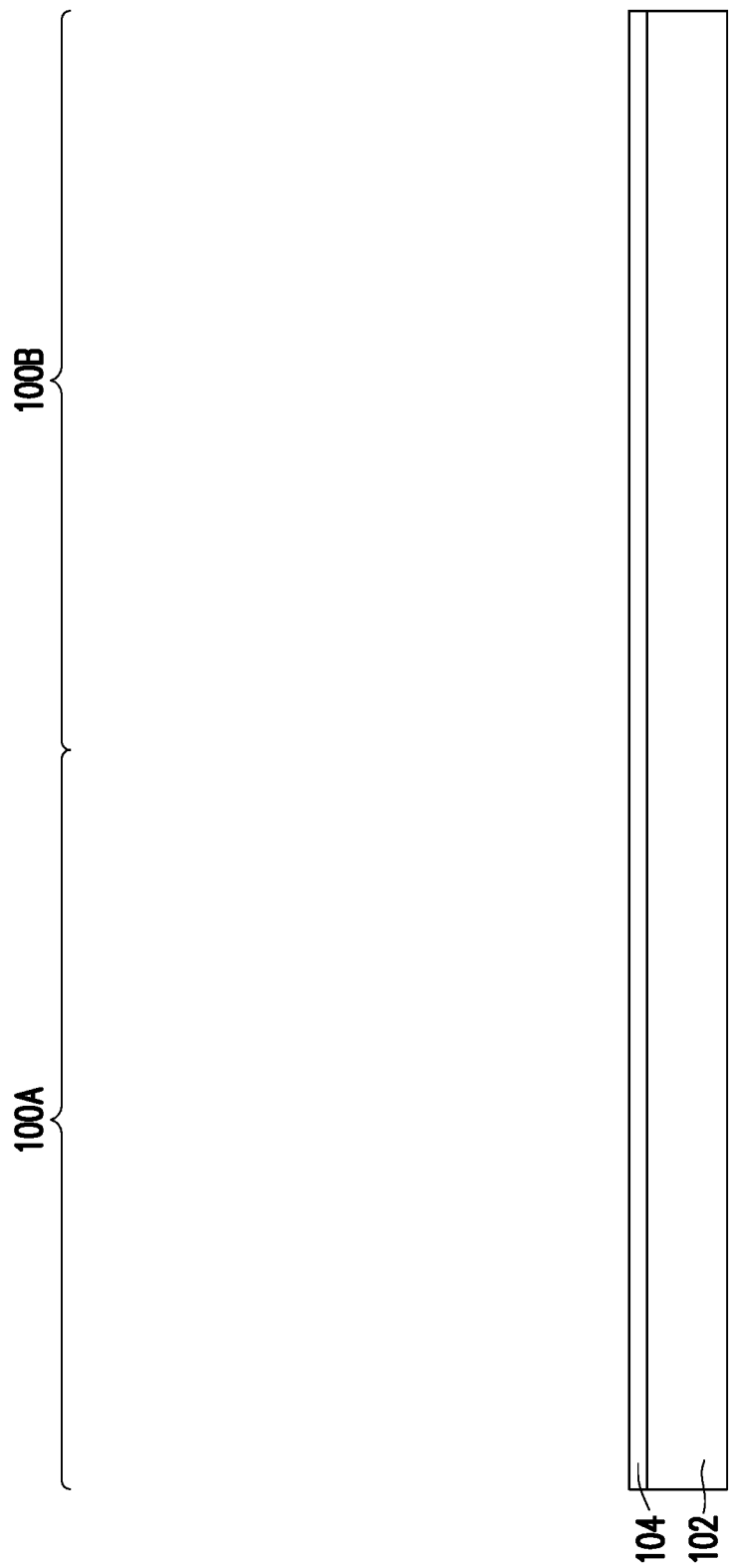
FIGS. 2 through 13 illustrate cross-sectional views of intermediate steps during a process for forming a package component, in accordance with some embodiments.

In FIG. 2, a carrier substrate 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages can be formed on the carrier substrate 102 simultaneously.

The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Figure 3:
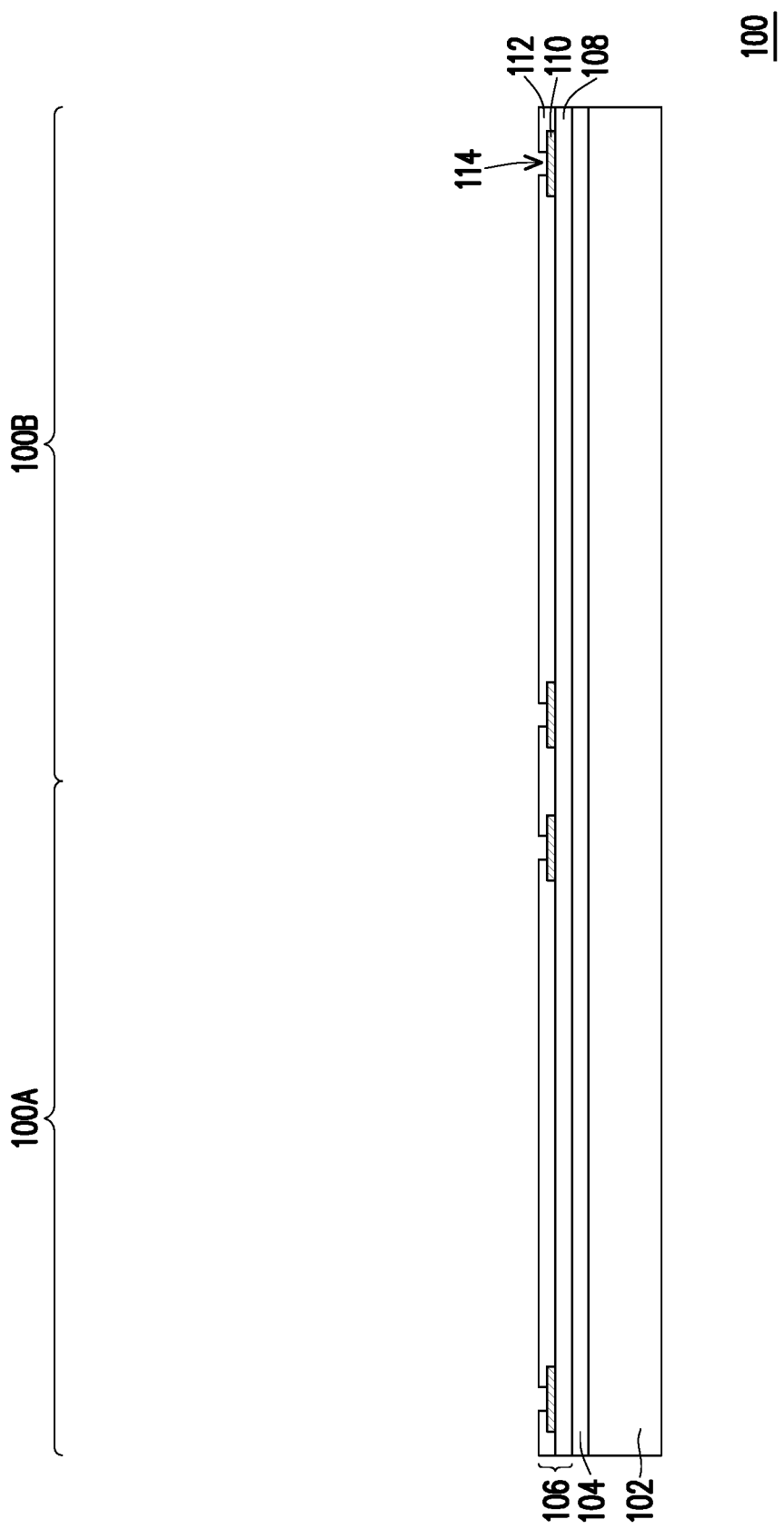

In FIG. 3, in some embodiments, a back-side redistribution structure 106 may be formed on the release layer 104. In the embodiment shown, the back-side redistribution structure 106 includes a dielectric layer 108, a metallization pattern 110 (sometimes referred to as redistribution layers or redistribution lines), and a dielectric layer 112. The back-side redistribution structure 106 is optional. In some embodiments, a dielectric layer without metallization patterns is formed on the release layer 104 in lieu of the back-side redistribution structure 106.

The dielectric layer 108 may be formed on the release layer 104. The bottom surface of the dielectric layer 108 may be in contact with the top surface of the release layer 104. In some embodiments, the dielectric layer 108 is formed of a polymer, such as polybenzoxazole (PBO), polyimide, benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 108 may be formed by any acceptable deposition process, such as spin coating, CVD, laminating, the like, or a combination thereof.

The metallization pattern 110 may be formed on the dielectric layer 108. As an example to form metallization pattern 110, a seed layer is formed over the dielectric layer 108. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 110. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 110.

The dielectric layer 112 may be formed on the metallization pattern 110 and the dielectric layer 108. In some embodiments, the dielectric layer 112 is formed of a polymer, which may be a photo-sensitive material such as PBO, polyimide, BCB, or the like, that may be patterned using a lithography mask. In other embodiments, the dielectric layer 112 is formed of a nitride such as silicon nitride; an oxide such as silicon oxide, PSG, BSG, BPSG; or the like. The dielectric layer 112 may be formed by spin coating, lamination, CVD, the like, or a combination thereof. The dielectric layer 112 is then patterned to form openings 114 exposing portions of the metallization pattern 110. The patterning may be formed by an acceptable process, such as by exposing the dielectric layer 112 to light when the dielectric layer 112 is a photo-sensitive material or by etching using, for example, an anisotropic etch. If the dielectric layer 112 is a photo-sensitive material, the dielectric layer 124 can be developed after the exposure.

It should be appreciated that the back-side redistribution structure 106 may include any number of dielectric layers and metallization patterns. If more dielectric layers and metallization patterns are to be formed, steps and processes discussed above may be repeated. The metallization patterns may include conductive lines and conductive vias. The conductive vias may be formed during the formation of the metallization pattern by forming the seed layer and conductive material of the metallization pattern in the opening of the underlying dielectric layer. The conductive vias may therefore interconnect and electrically couple the various conductive lines.

Figure 4:
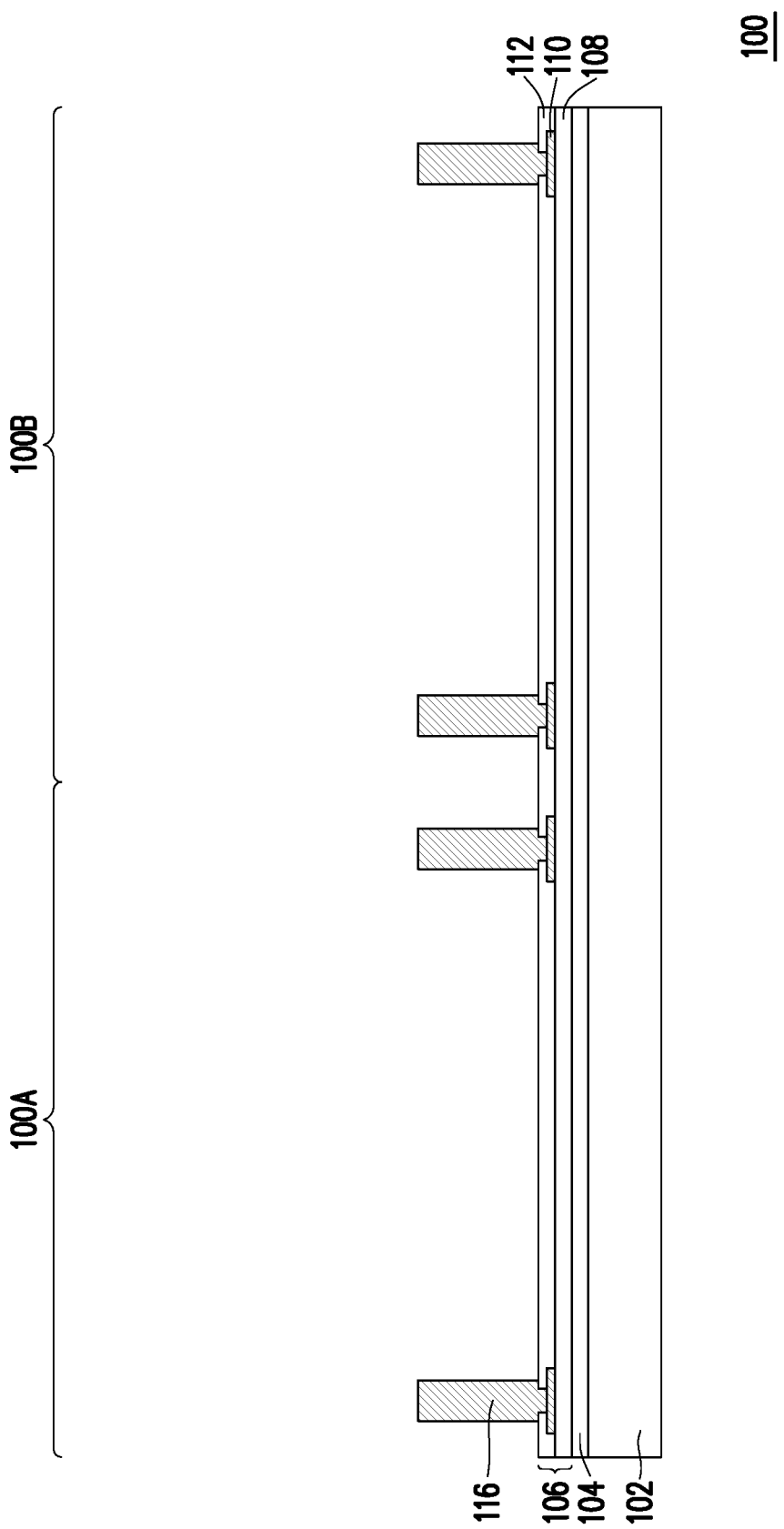

In FIG. 4, in embodiments which use the back-side redistribution structure 106, through vias 116 may be formed in the openings 114 which extend away from the topmost dielectric layer of the back-side redistribution structure 106 (e.g., the dielectric layer 112). As an example to form the through vias 116, a seed layer (not shown) is formed over the back-side redistribution structure 106, e.g., on the dielectric layer 112 and portions of the metallization pattern 110 exposed by the openings 114. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 116.

Figure 5:
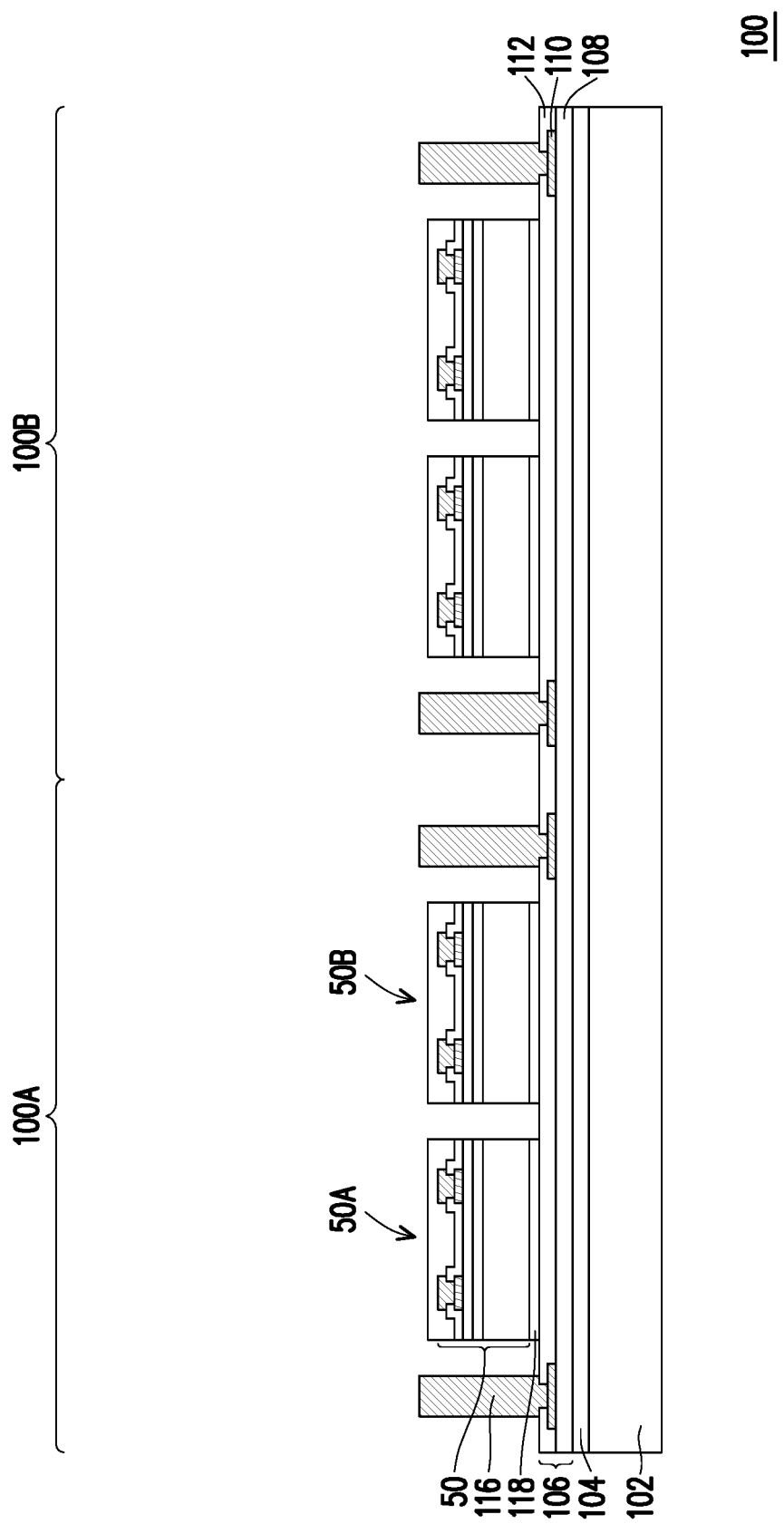

In FIG. 5, integrated circuit dies 50 are adhered to the dielectric layer 112 by an adhesive 118. A desired type and quantity of integrated circuit dies 50 are adhered in each of the package regions 100A and 100B. In the embodiment shown, multiple integrated circuit dies 50 are adhered adjacent one another, including a first integrated circuit die 50A and a second integrated circuit die 50B, though additional integrated circuit dies 50 may be included as desired. The first integrated circuit die 50A may be a logic device, such as a central processing unit (CPU), graphics processing unit (GPU), system-on-a-chip (SoC), microcontroller, or the like. The second integrated circuit die 50B may be a memory device, such as a dynamic random access memory (DRAM) die, static random access memory (SRAM) die, hybrid memory cube (HMC) module, a high bandwidth memory (HBM) module, or the like. In some embodiments, the integrated circuit dies 50A and 50B may be the same type of dies, such as SoC dies. The first integrated circuit die 50A and second integrated circuit die 50B may be formed in processes of a same technology node, or may be formed in processes of different technology nodes. For example, the first integrated circuit die 50A may be of a more advanced process node than the second integrated circuit die 50B. The integrated circuit dies 50A and 50B may have different sizes (e.g., different heights and/or surface areas), or may have the same size (e.g., same heights and/or surface areas). The space available for the through vias 116 in the package regions 100A and 100B may be limited, particularly when the integrated circuit dies 50A and 50B include devices with a large footprint, such as SoCs. Use of the back-side redistribution structure 106 allows for an improved interconnect arrangement when the package regions 100A and 100B have limited space available for the through vias 116.

The adhesive 118 is on back-sides of the integrated circuit dies 50A and 50B which adheres the integrated circuit dies 50A and 50B to the back-side redistribution structure 106, such as to the dielectric layer 112. The adhesive 118 may be any suitable adhesive, epoxy, die attach film (DAF), or the like. The adhesive 118 may be applied to back-sides of the integrated circuit dies 50A and 50B or may be applied over the surface of the carrier substrate 102. For example, the adhesive 118 may be applied to the back-sides of the integrated circuit dies 50A and 50B before singulating to separate the integrated circuit dies 50A and 50B.

Figure 6:
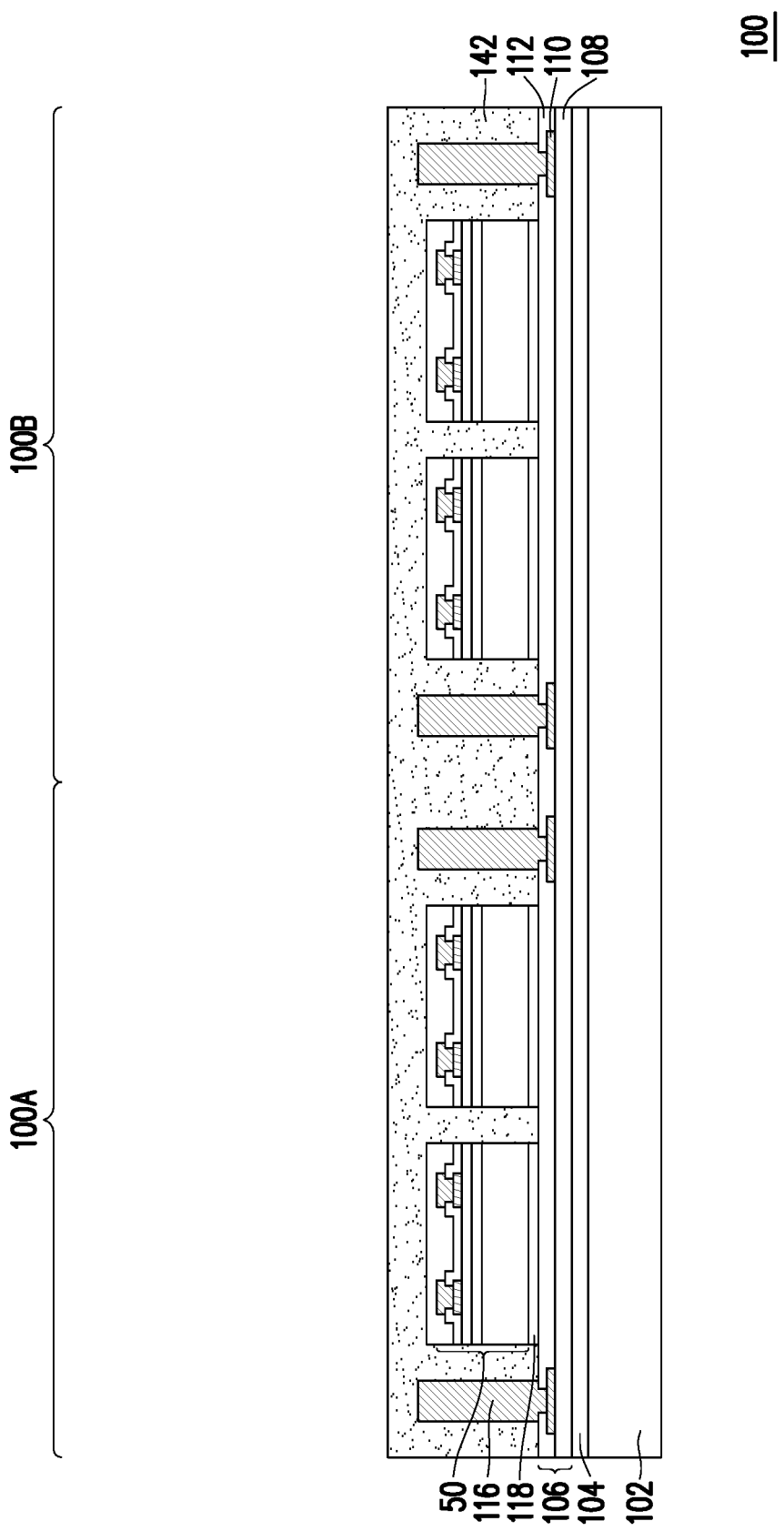

In FIG. 6, an encapsulant 142 is formed on and around the various components. After formation, the encapsulant 142 encapsulates the through vias 116 and integrated circuit dies 50A and 50B. The encapsulant 142 may be a molding compound, epoxy, or the like. The encapsulant 142 may be applied by compression molding, transfer molding, or the like, and may be formed over the carrier substrate 102 such that the through vias 116 and/or the integrated circuit dies 50A and 50B are buried or covered. The encapsulant 142 is further formed in gap regions between the integrated circuit dies 50. The encapsulant 142 may be applied in liquid or semi-liquid form and then subsequently cured.

Figure 7:
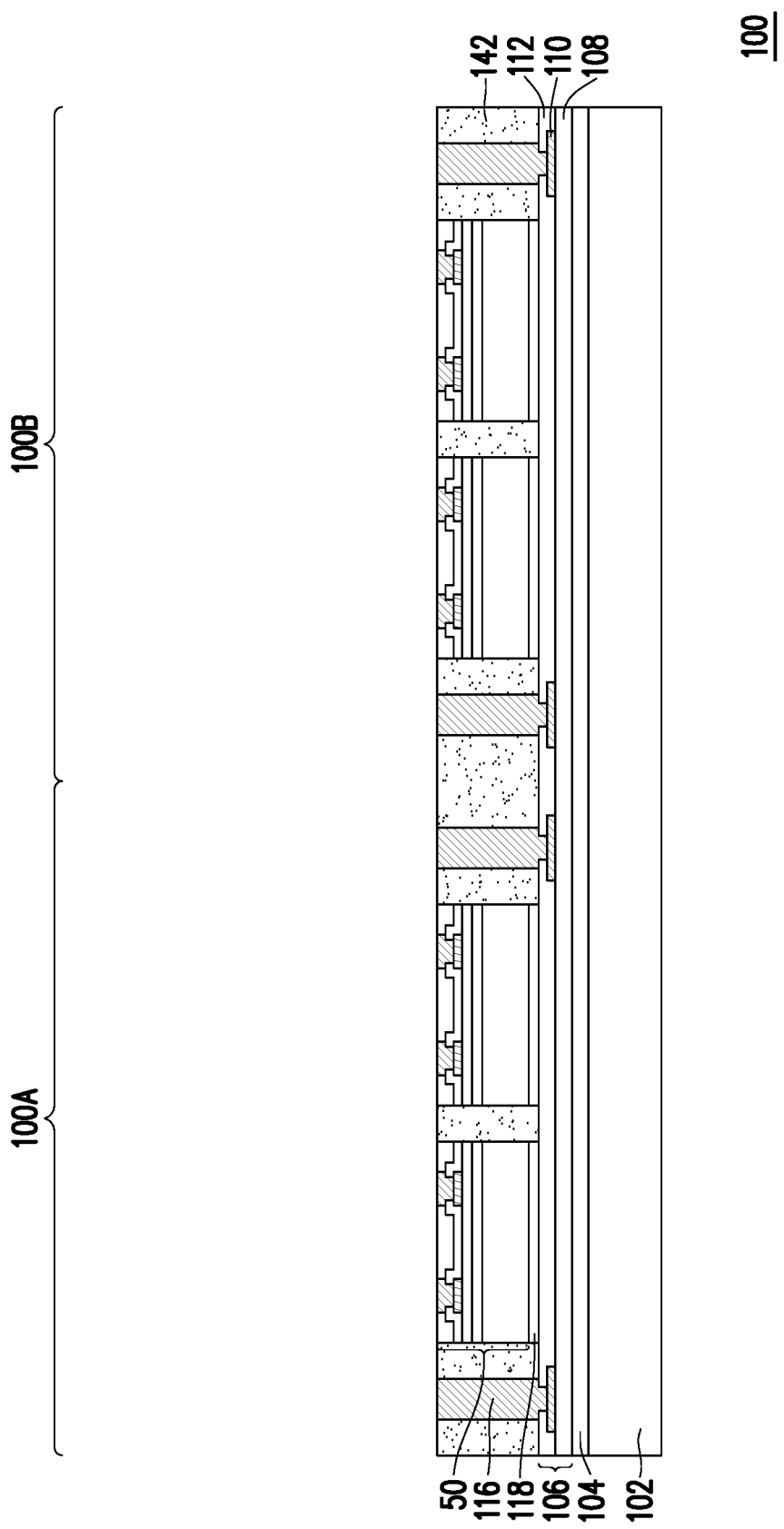

In FIG. 7, a planarization process is performed on the encapsulant 142 to expose the through vias 116 and the die connectors 66. The planarization process may also remove material of the through vias 116, dielectric layer 68, and/or die connectors 66 until the die connectors 66 and through vias 116 are exposed. Top surfaces of the through vias 116, die connectors 66, dielectric layer 68, and encapsulant 142 are coplanar after the planarization process. The planarization process may be, for example, a chemical-mechanical polish (CMP), a grinding process, or the like. In some embodiments, the planarization may be omitted, for example, if the through vias 116 and/or die connectors 66 are already exposed.

In FIGS. 8 through 11, a front-side redistribution structure 122 (see FIG. 11) is formed over the encapsulant 142, through vias 116, and integrated circuit dies 50A and 50B. The front-side redistribution structure 122 includes dielectric layers 124, 128, 132, and 136; and metallization patterns 126, 130, and 134. The metallization patterns may also be referred to as redistribution layers or redistribution lines. The front-side redistribution structure 122 is shown as an example having three layers of metallization patterns. More or fewer dielectric layers and metallization patterns may be formed in the front-side redistribution structure 122. If fewer dielectric layers and metallization patterns are to be formed, steps and process discussed below may be omitted. If more dielectric layers and metallization patterns are to be formed, steps and processes discussed below may be repeated.

Figure 8:
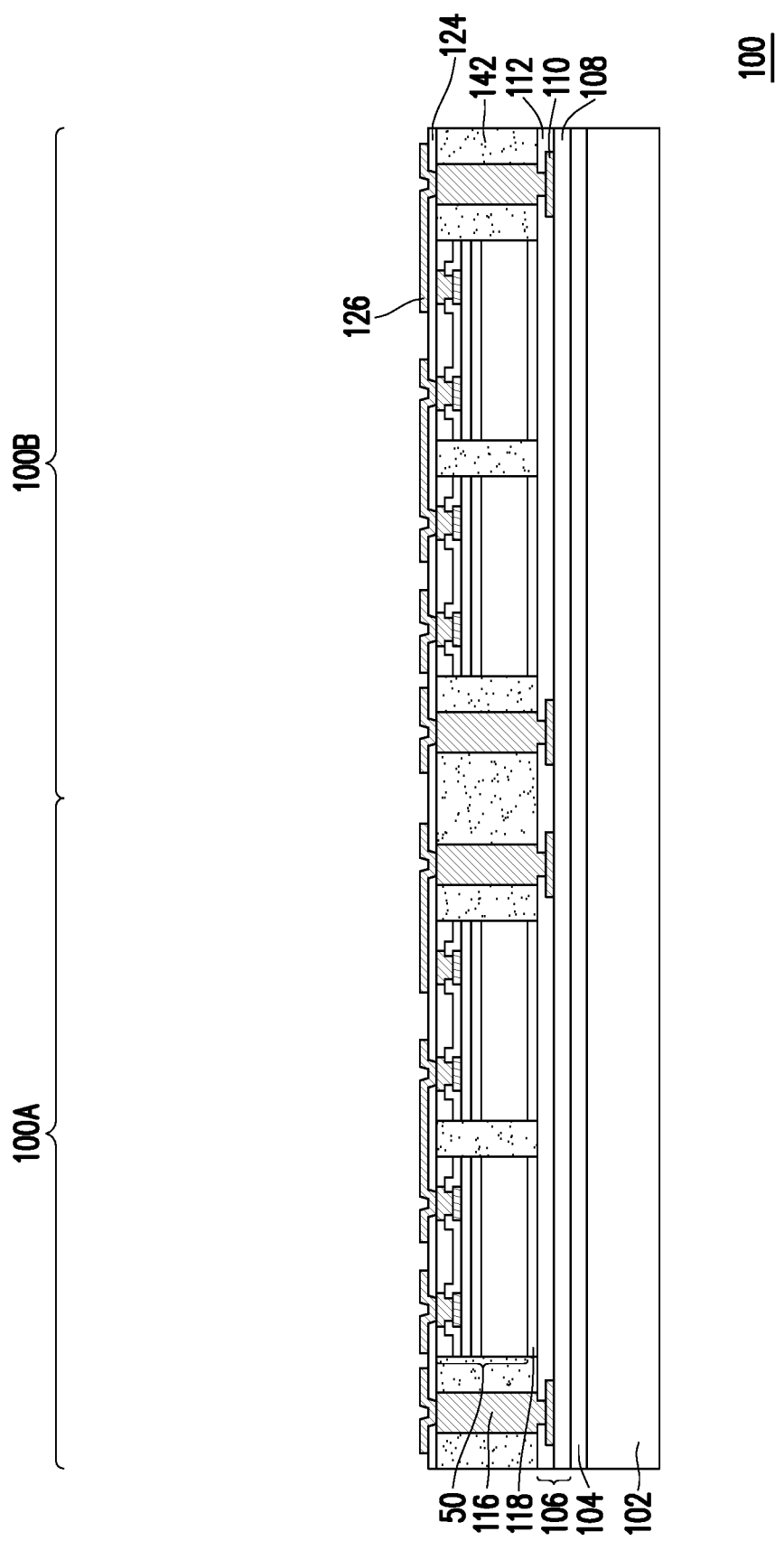

In FIG. 8, the dielectric layer 124 is deposited on the encapsulant 142, through vias 116, and die connectors 66. In some embodiments, the dielectric layer 124 is formed of a photo-sensitive material such as PBO, polyimide, BCB, or the like, which may be patterned using a lithography mask. The dielectric layer 124 may be formed by spin coating, lamination, CVD, the like, or a combination thereof. The dielectric layer 124 is then patterned. The patterning forms openings exposing portions of the through vias 116 and the die connectors 66. The patterning may be by an acceptable process, such as by exposing the dielectric layer 124 to light when the dielectric layer 124 is a photo-sensitive material or by etching using, for example, an anisotropic etch. If the dielectric layer 124 is a photo-sensitive material, the dielectric layer 124 can be developed after the exposure.

The metallization pattern 126 is then formed. The metallization pattern 126 includes line portions (also referred to as conductive lines) on and extending along the major surface of the dielectric layer 124. The metallization pattern 126 further includes via portions (also referred to as conductive vias) extending through the dielectric layer 124 to physically and electrically couple the through vias 116 and the integrated circuit dies 50. As an example to form the metallization pattern 126, a seed layer is formed over the dielectric layer 124 and in the openings extending through the dielectric layer 124. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 126. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 126. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 9:
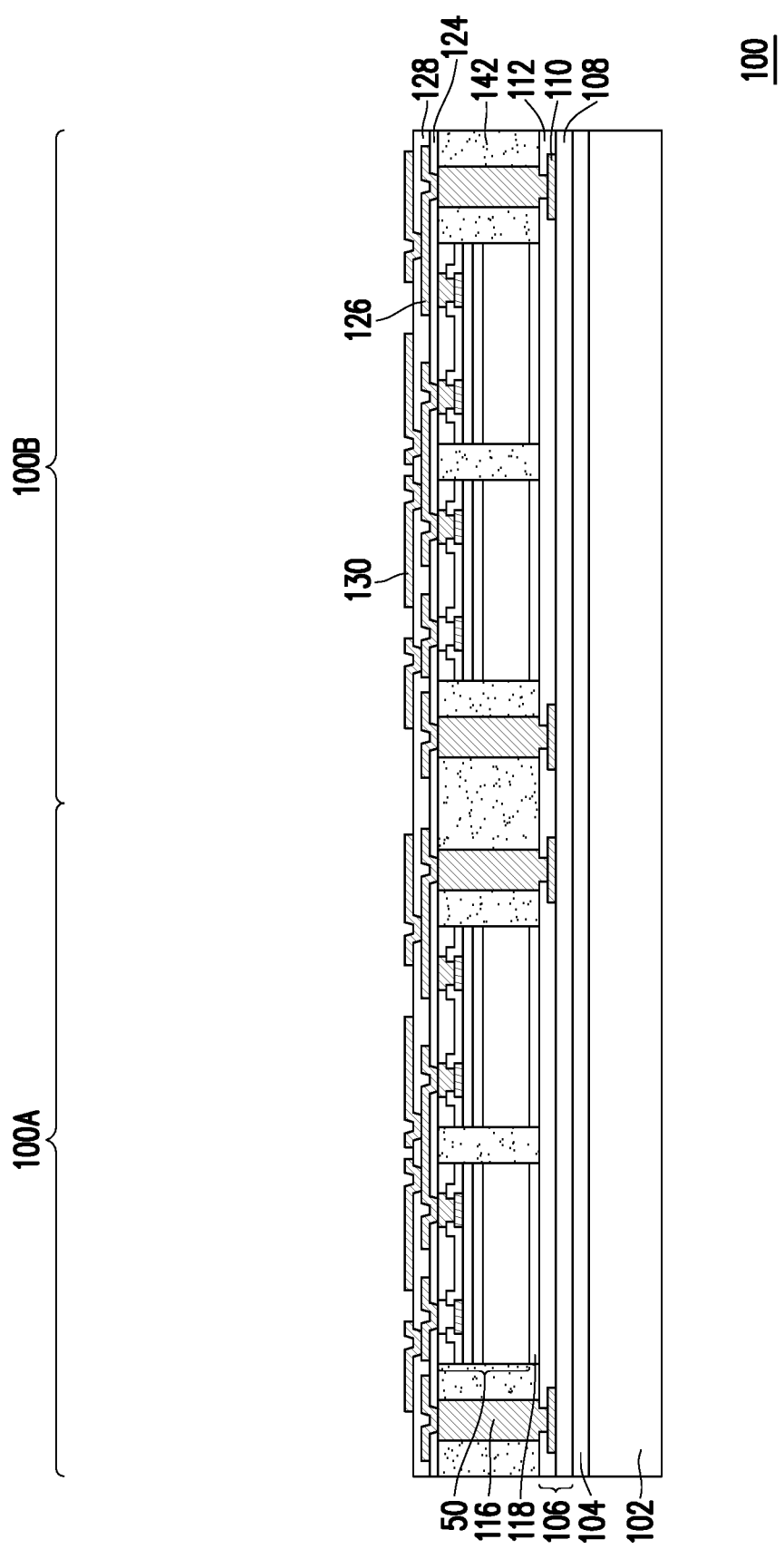

In FIG. 9, the dielectric layer 128 is deposited on the metallization pattern 126 and dielectric layer 124. The dielectric layer 128 may be formed in a manner similar to the dielectric layer 124, and may be formed of a similar material as the dielectric layer 124.

The metallization pattern 130 is then formed. The metallization pattern 130 includes line portions on and extending along the major surface of the dielectric layer 128. The metallization pattern 130 further includes via portions extending through the dielectric layer 128 to physically and electrically couple the metallization pattern 126. The metallization pattern 130 may be formed in a similar manner and of a similar material as the metallization pattern 126. In some embodiments, the metallization pattern 130 has a different size than the metallization pattern 126. For example, the conductive lines and/or vias of the metallization pattern 130 may be wider or thicker than the conductive lines and/or vias of the metallization pattern 126. Further, the metallization pattern 130 may be formed to a greater pitch than the metallization pattern 126.

Figure 10:
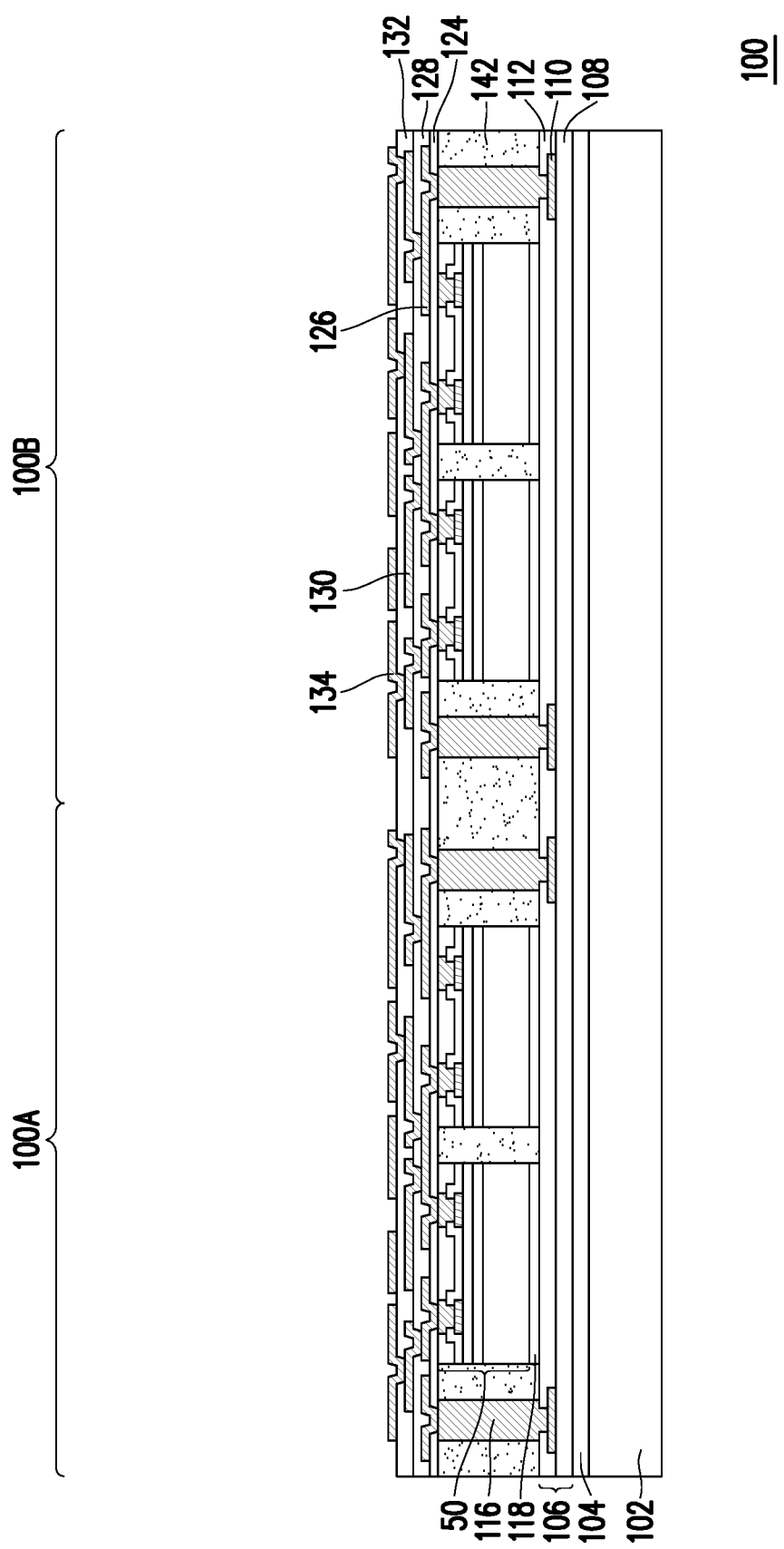

In FIG. 10, the dielectric layer 132 is deposited on the metallization pattern 130 and dielectric layer 128. The dielectric layer 132 may be formed in a manner similar to the dielectric layer 124, and may be formed of a similar material as the dielectric layer 124.

The metallization pattern 134 is then formed. The metallization pattern 134 includes line portions on and extending along the major surface of the dielectric layer 132. The metallization pattern 134 further includes via portions extending through the dielectric layer 132 to physically and electrically couple the metallization pattern 130. The metallization pattern 134 may be formed in a similar manner and of a similar material as the metallization pattern 126. The metallization pattern 134 is the topmost metallization pattern of the front-side redistribution structure 122. As such, all of the intermediate metallization patterns of the front-side redistribution structure 122 (e.g., the metallization patterns 126 and 130) are disposed between the metallization pattern 134 and the integrated circuit dies 50A and 50B. In some embodiments, the metallization pattern 134 has a different size than the metallization patterns 126 and 130. For example, the conductive lines and/or vias of the metallization pattern 134 may be wider or thicker than the conductive lines and/or vias of the metallization patterns 126 and 130. Further, the metallization pattern 134 may be formed to a greater pitch than the metallization pattern 130.

Figure 11:
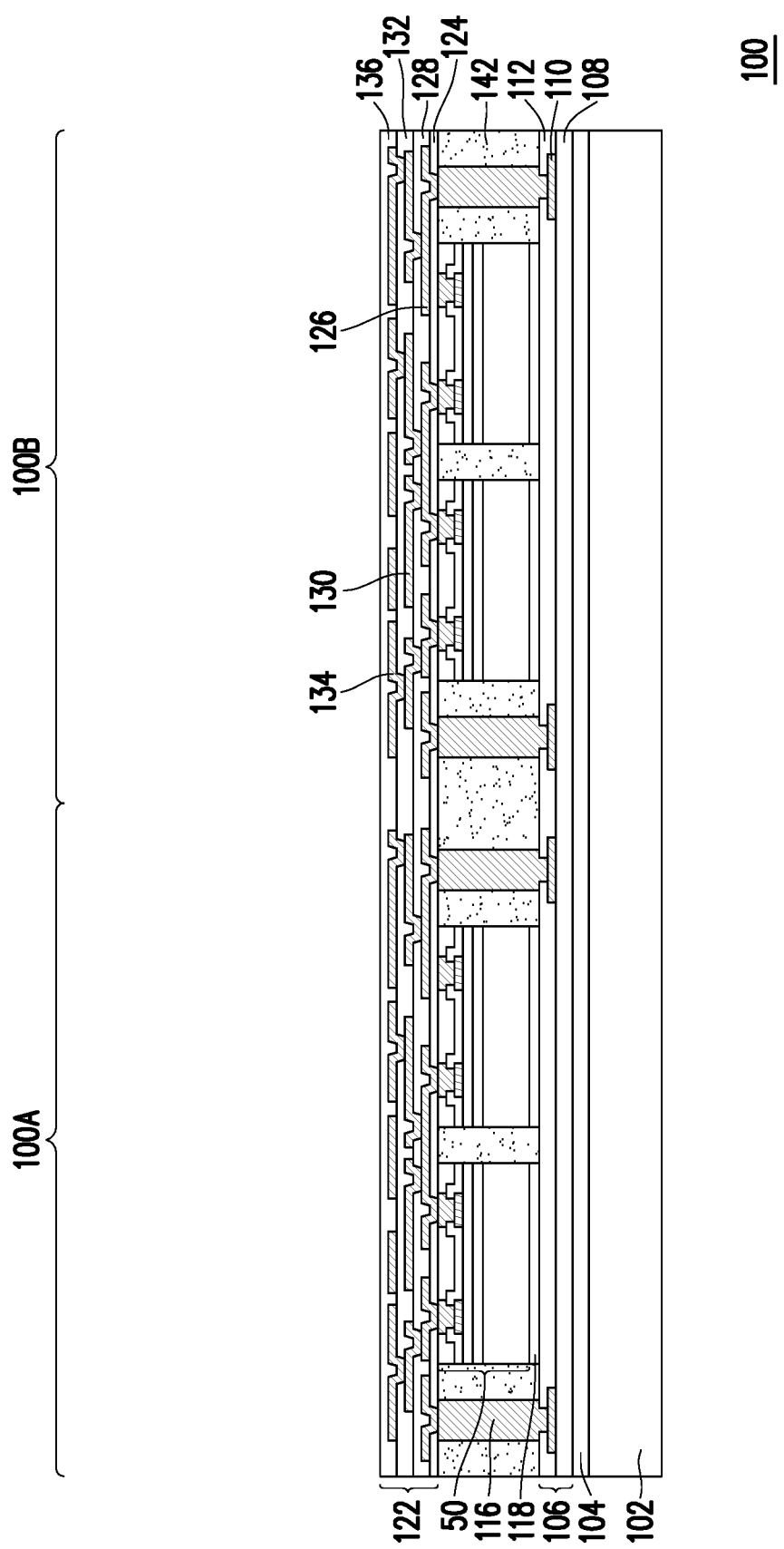

In FIG. 11, the dielectric layer 136 is deposited on the metallization pattern 134 and dielectric layer 132. The dielectric layer 136 may be formed in a manner similar to the dielectric layer 124, and may be formed of the same material as the dielectric layer 124. The dielectric layer 136 is the topmost dielectric layer of the front-side redistribution structure 122. As such, all of the metallization patterns of the front-side redistribution structure 122 (e.g., the metallization patterns 126, 130, and 134) are disposed between the dielectric layer 136 and the integrated circuit dies 50A and 50B. Further, all of the intermediate dielectric layers of the front-side redistribution structure 122 (e.g., the dielectric layers 124, 128, 132) are disposed between the dielectric layer 136 and the integrated circuit dies 50A and 50B.

Figure 12:
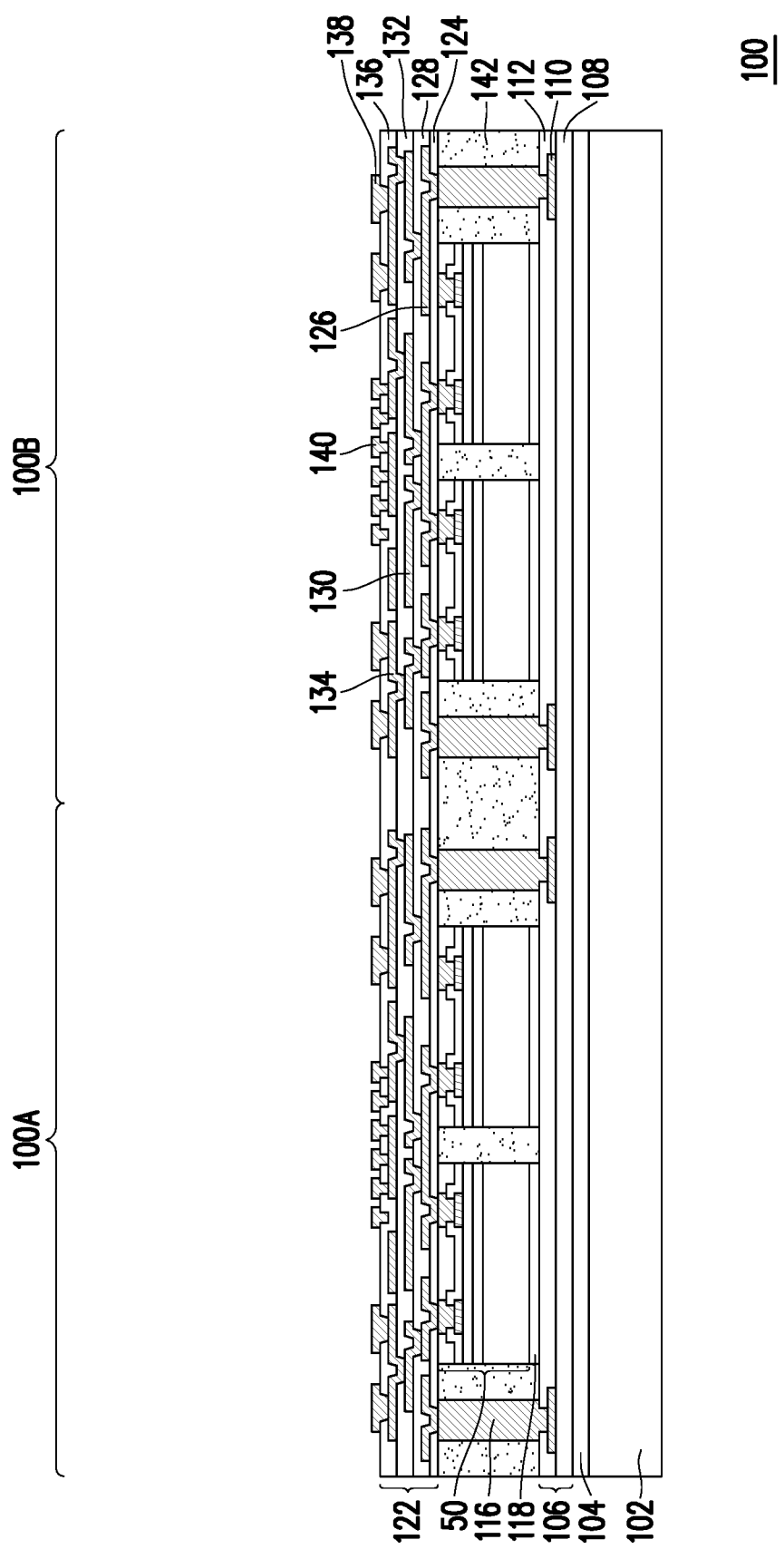

In FIG. 12, contact pads 138 are formed for external connection to the front-side redistribution structure 122. The contact pads 138 have bump portions on and extending along the major surface of the dielectric layer 136, and have via portions extending through the dielectric layer 136 to physically and electrically couple the metallization pattern 134. As a result, the contact pads 138 are electrically coupled to the through vias 116 and the integrated circuit dies 50A and 50B. In some embodiments, the contact pads 138 may have an upper surface which is level with the upper surface of the dielectric layer 136. The contact pads 138 may be formed of the same material as the metallization pattern 126. In some embodiments, the contact pads 138 have a different size than the metallization patterns 126, 130, and 134.

Contact pads 140 are formed for providing connector points for an IVR chip (or other device) which may be bonded in a subsequent process. The contact pads 140 may have bump portions on and extending along the major surface of the dielectric layer 136 and via portions extending through the dielectric layer 136 to physically and electrically couple the metallization pattern 134. In some embodiments, the contact pads 140 may have an upper surface which is level with the upper surface of the dielectric layer 136. The metallization pattern 134 may electrically couple certain of the contact pads 140 to voltage inputs of the integrated circuit dies 50A and/or 50B for routing a regulated voltage output from an IVR chip (discussed in detail further below) to the integrated circuit dies 50A and/or 50B. The metallization pattern 134 may electrically couple others of the contact pads 140 to certain of the contact pads 138 for routing a voltage input signal to the IVR chip.

Other features and processes may also be included. For example, testing structures may be included to aid in the verification testing of the three dimensional (3D) packaging or 3D Integrated Circuit (3DIC) devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
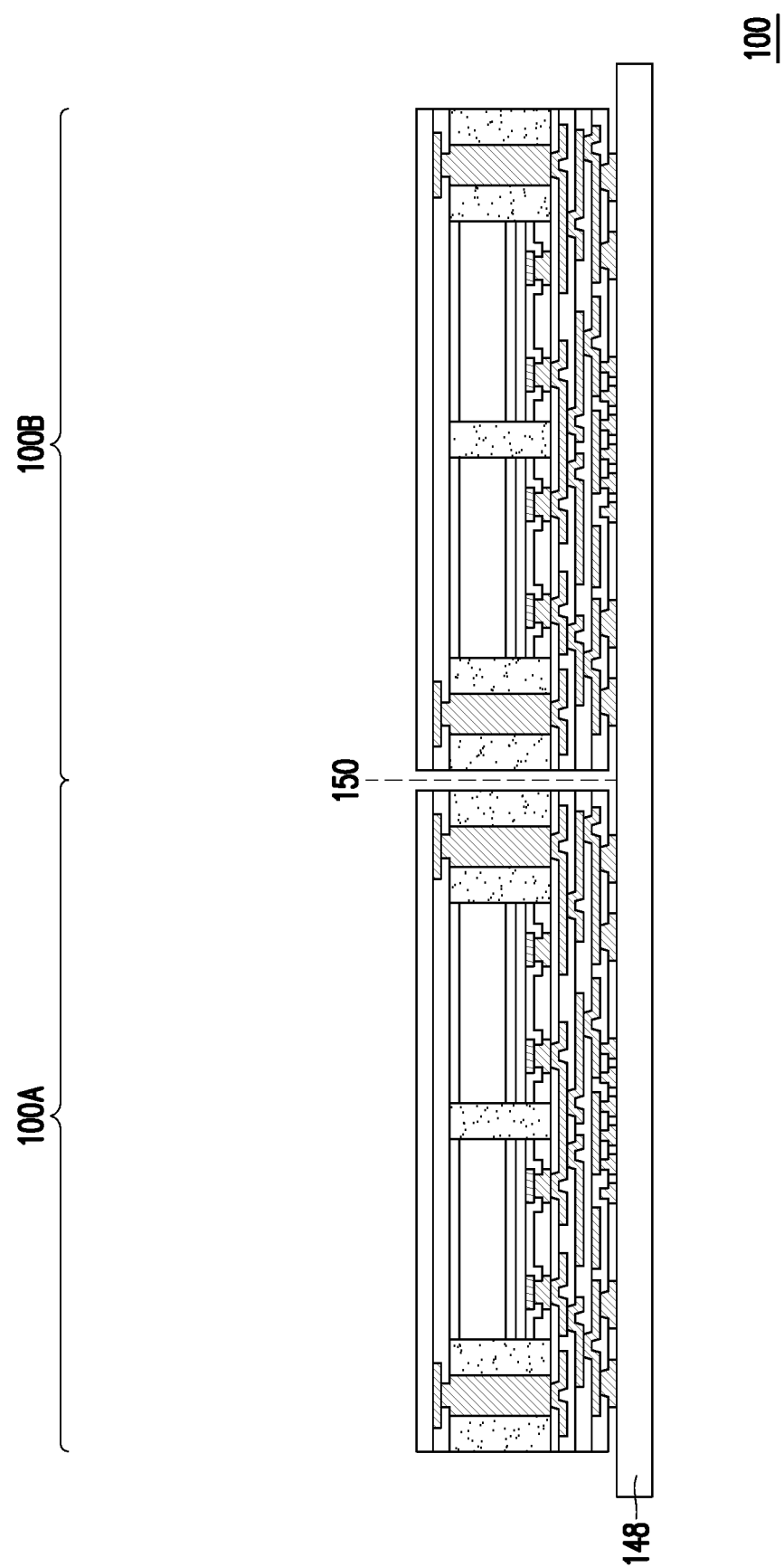

In FIG. 13, a singulation process is performed by sawing along scribe line regions 150, e.g., between the first package region 100A and the second package region 100B. The sawing singulates the first package region 100A from the second package region 100B. In some embodiments, prior to singulation, a carrier substrate de-bonding is performed to detach (or "de-bond") the carrier substrate 102 from the back-side redistribution structure 106, e.g., the dielectric layer 108. In accordance with some embodiments, the de-bonding includes projecting a light such as a laser light or an UV light on the release layer 104 so that the release layer 104 decomposes under the heat of the light and the carrier substrate 102 can be removed. The structure is then flipped over and placed on a tape, such as tape 148. In some embodiments, the singulation process may be performed by sawing from the back of the first package region 100A toward the front of the first package region 100A. In other embodiments, the structure may be flipped over again and placed on another tape (not shown) so that the singulation process may be performed by sawing from the front side of the first package region 100A toward the back of the first package region 100A. Following the singulation process, the first package region 100A is singulated from the second package region 100B resulting in a first package component 100.

Figure 14:
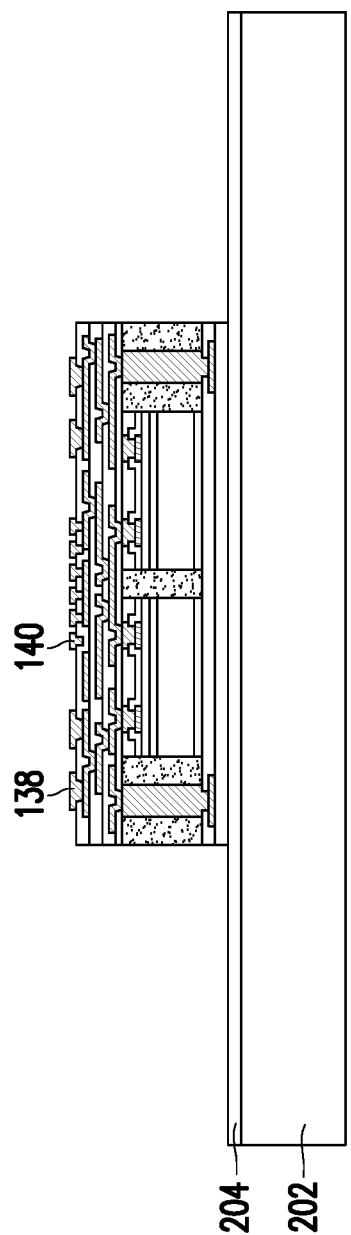
FIGS. 14 through 22 illustrate cross-sectional views of intermediate steps during a process for forming a package component including an embedded integrated voltage regulator, in accordance with some embodiments.

FIGS. 14 through 21 illustrate cross-sectional views of intermediate steps during a process for forming a second package component 200. In FIG. 14, one or more of the singulated first package components 100 may be mounted to a carrier substrate 202. Additional package components (not shown) may also be mounted to the carrier substrate 202. The additional package components may the same as first package component 100 or may be a different type of package component. The carrier substrate 202 may be similar to the carrier substrate 102. The carrier substrate 202 may have release layer 204 formed thereon which may be formed using materials and processes such as those describe above with respect to release layer 104.

Figure 15:
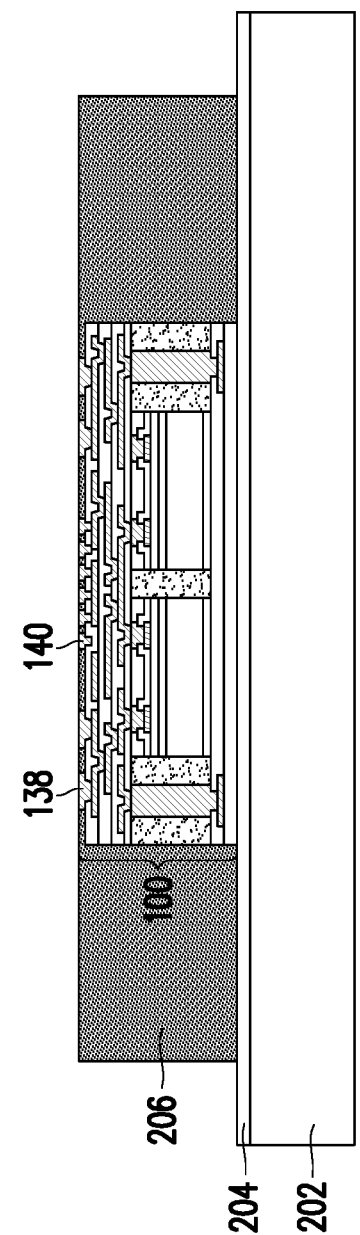

In FIG. 15, an encapsulant 206 is formed on and around the various components. After formation, the encapsulant 206 encapsulates the first package components 100. The encapsulant 206 may be a molding compound, epoxy, or the like. The encapsulant 206 may be applied by compression molding, transfer molding, or the like, and may be formed over the carrier substrate 202 such that the first package components 100 are buried or covered. The encapsulant 206 is further formed in gap regions between first package components 100. The encapsulant 206 may be applied in liquid or semi-liquid form and then subsequently cured. Following the formation of the encapsulant 206, a planarization process is performed on the encapsulant 206 to expose the contact pads 138 and contact pads 140. Top surfaces of the contact pads 138, contact pads 140, and encapsulant 206 are coplanar after the planarization process. The distance between the top surface of the encapsulant 206 and top surface of the dielectric layer 136 may be between about 5 μm and about 100 μm, such as about 10 μm, although other distances are contemplated and may be used. In some other embodiments, the planarization process may level the upper surface of the encapsulant 206 and upper surface of the dielectric layer 136. The planarization process may be, for example, a chemical-mechanical polish (CMP), a grinding process, or the like. In some embodiments, the planarization may be omitted, for example, if the contact pads 138 and contact pads 140 are already exposed.

Figure 16:
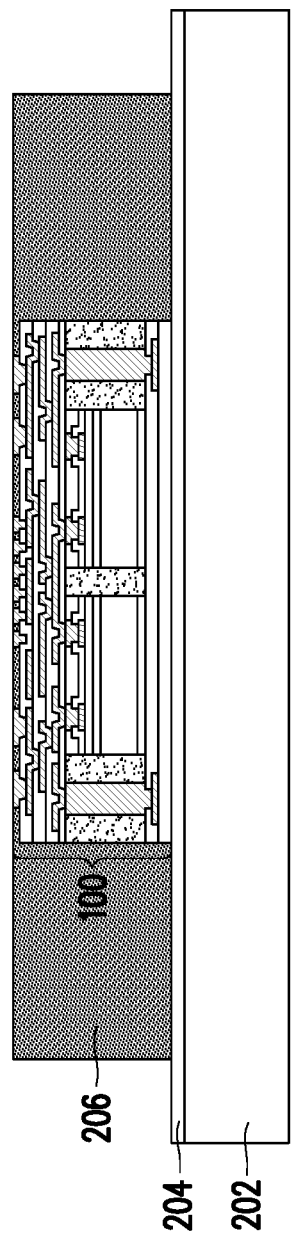

In FIG. 16, an integrated voltage regulator (IVR) 210 is provided and aligned to the contact pads 140. The IVR 210 includes contact pads 205, each of which corresponds to a contact pad of contact pads 140. The IVR 210 may also include conductive connectors 207 formed on each of the contact pads 205. The conductive connectors 207 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 207 may include a conductive material such as solder, copper, aluminum, gold, nickel, silver, palladium, tin, the like, or a combination thereof. In some embodiments, the conductive connectors 207 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 207 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 207 may have a pitch between about 20 µm and about 80 µm, such as about 40 µm, although other pitches are contemplated and may be used. The pitch corresponds to the placement of the contact pads 140. The IVR 210 may be positioned using a pick and place process or other suitable process.

The IVR 210 may have a thickness between about 10 µm to about 200 µm, such as about 30 µm, although other dimensions are contemplated and may be used. The IVR 210 may have a width dimension between about 2 mm and 40 mm, such as about 5 mm, and a depth dimension (into and out of the page) between about 2 mm and about 80 mm, such as about 5 mm, although other dimensions are contemplated and may be used.

Figure 17:
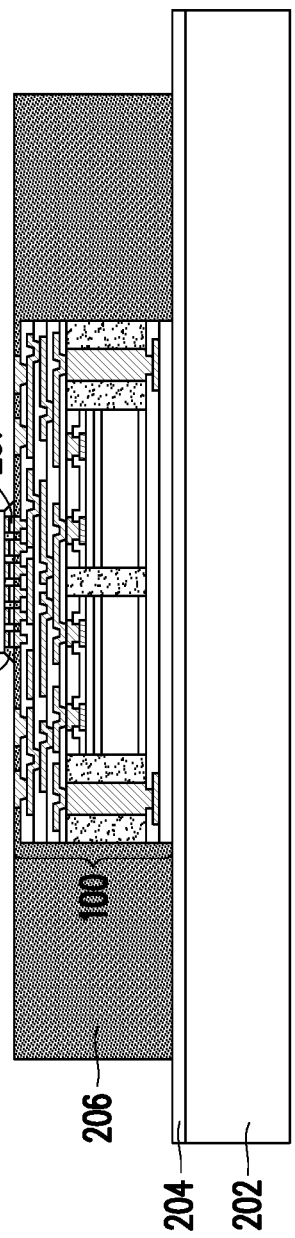

In FIG. 17, the IVR 210 is bonded to the contact pads 140 by the conductive connectors 207. In some embodiments, the conductive connectors 207 may be reflowed to couple the IVR 210 to the contact pads 140. In some embodiments, the bonding can be by the flip chip process illustrated. In other embodiments, the IVR 210 may be a surface mount device. In yet other embodiments, the IVR 210 may be bonded by a wire bonding process.

In some embodiments, the conductive connectors 207 have an epoxy flux (not shown) formed thereon before they are reflowed with at least some of the epoxy portion of the epoxy flux remaining after the IVR 210 is attached to the first package component 100.

In some embodiments, an underfill 208 is formed between the first package component 100 and the IVR 210, surrounding the conductive connectors 207. The underfill 208 may reduce stress and protect the joints resulting from the reflowing of the conductive connectors 207. The underfill may be formed by a capillary flow process after the IVR 210 is attached, or may be formed by a suitable deposition method before the IVR 210 is attached. In embodiments where the epoxy flux is formed, it may act as the underfill 208.

Although only one IVR 210 is depicted, it should be understood that multiple IVR devices may be used as appropriate. The lateral extents of IVR 210 may be within the lateral extents of the front-side redistribution structure 122 (see FIG. 12). In other words, the footprint of the IVR 210 may by completely overlapped by the footprint of the first package component 100. In other embodiments, an edge portion of the IVR 210 may overhang the lateral extents of the front-side redistribution structure 122. In some embodiments, the design of the front-side redistribution structure 122 may provide a series of one or more vias in the metallization patterns (e.g., metallization patterns 126, 130, and 134 of FIG. 12) of the front-side redistribution structure 122 so that the vias provide a short path to a voltage input of integrated circuit dies 50A and/or 50B.

In some embodiments, the vias may be aligned and stacked through each of the dielectric layers of the redistribution structure to form a short path. In some embodiments, the IVR 210 may have a regulated voltage output vertically aligned with a voltage input of the integrated circuit dies 50A and/or 50B, and in such embodiments the vias may also be aligned and stacked through each of the dielectric layers to form a straight line vertical path between the IVR 210 output voltage and the voltage input of the integrated circuit dies 50A and/or 50B. In some embodiments the total length of the path from the regulated voltage output of the IVR 210 to the voltage input of integrated circuit dies 50A and/or 50B may be between about 20 µm and about 1,000 µm, between about 100 µm and about 5,000 µm, or between about 100 µm and about 40,000 µm.

A short path provides less IR drop from the IVR 210 to the integrated circuit dies 50A and/or 50B than, for example, a voltage regulator mounted aside the integrated circuit dies 50A and/or 50B using, for example, a micro lead-frame chip carrier (MLCC). In some embodiments, the total IR drop may be between about 0.5% and 2.5%, such as about 1.4%, although other values are contemplated. In contrast, a voltage regulator mounted via an MLCC may have an IR drop of about 4.5% or more.

One of skill in the art will recognize that other devices may be used instead of or in addition to the IVR 210. In some embodiments, devices such as an integrated package device (IPD), memory device such as SRAM or the like, silicon bridge, and/or other devices may be used to create a system on wafer device. For ease of reference, the disclosure below discusses IVR 210 specifically, but it should be understood that any of these devices may be used and are within the scope of this disclosure.

Figure 18:
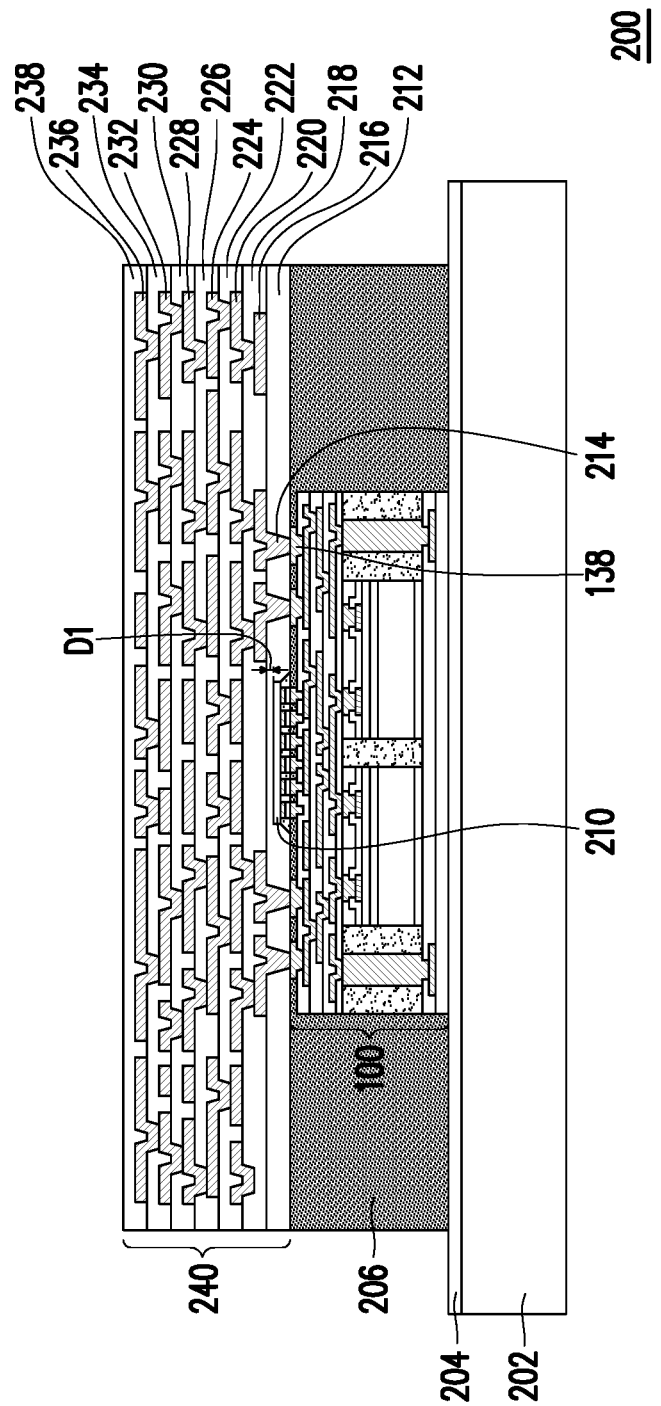

In FIG. 18, a redistribution structure 240 (see FIG. 11) is formed over the encapsulant 206, first package component 100, and the IVR 210. The redistribution structure 240 includes dielectric layers 212, 218, 222, 226, 230, 234, and 238; and metallization patterns 216, 220, 224, 228, 232, and 236. The metallization patterns may also be referred to as redistribution layers or redistribution lines. The redistribution structure 240 is shown as an example having six layers of metallization patterns. More or fewer dielectric layers and metallization patterns may be formed in the redistribution structure 240.

The dielectric layer 212 is deposited on the encapsulant 206 and contact pads 138, and IVR 210. In some embodiments, the dielectric layer 212 is formed of a photo-sensitive material such as PBO, polyimide, BCB, or the like, which may be patterned using a lithography mask. The dielectric layer 212 may be formed by spin coating, lamination, CVD, the like, or a combination thereof. The dielectric layer 212 may have a thickness between about 35 µm and about 250 µm thick, such as about 50 µm thick, although other thicknesses may be used and are contemplated. The dielectric layer 212 is then patterned. The patterning forms openings exposing portions of the contact pads 138. The patterning may be by an acceptable process, such as by exposing the dielectric layer 212 to light when the dielectric layer 212 is a photo-sensitive material or by etching using, for example, an anisotropic etch. If the dielectric layer 212 is a photo-sensitive material, the dielectric layer 212 can be developed after the exposure.

In some embodiments, a distance D1 between the upper surface of the IVR 210 and the upper surface of the dielectric layer 212 is between about 0 µm (level with) and about 100 µm, such as about 15 µm, though other dimensions are contemplated. In other embodiments, the upper surface of the IVR 210 may protrude above the upper surface of the dielectric layer 212 (see FIG. 19).

The metallization pattern 216 is then formed. The metallization pattern 216 includes line portions (also referred to as conductive lines) on and extending along the major surface of the dielectric layer 212. The metallization pattern 216 further includes through vias 214 (also referred to as conductive vias) extending through the dielectric layer 212 to physically and electrically couple the contact pads 138. As an example to form the metallization pattern 216, a seed layer is formed over the dielectric layer 212 and in the openings extending through the dielectric layer 212. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 216. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 216. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The process described above of forming dielectric layer 212 and metallization pattern 216 may be repeated as many times as necessary to form a desired number of layers of the redistribution structure 240. In the illustrated embodiment, the process of forming dielectric layer 212 and metallization pattern 216 may be repeated to form dielectric layer 218 and metallization pattern 220, then dielectric layer 222 and metallization pattern 224, then dielectric layer 226 and metallization pattern 228, then dielectric layer 230 and metallization pattern 232, then dielectric layer 234 and metallization pattern 236. A final dielectric layer 238 may be formed on the metallization pattern 236, which may be formed in a manner similar to the dielectric layer 212. The dielectric layer 238 is the topmost dielectric layer of the redistribution structure 240.

Figure 19:
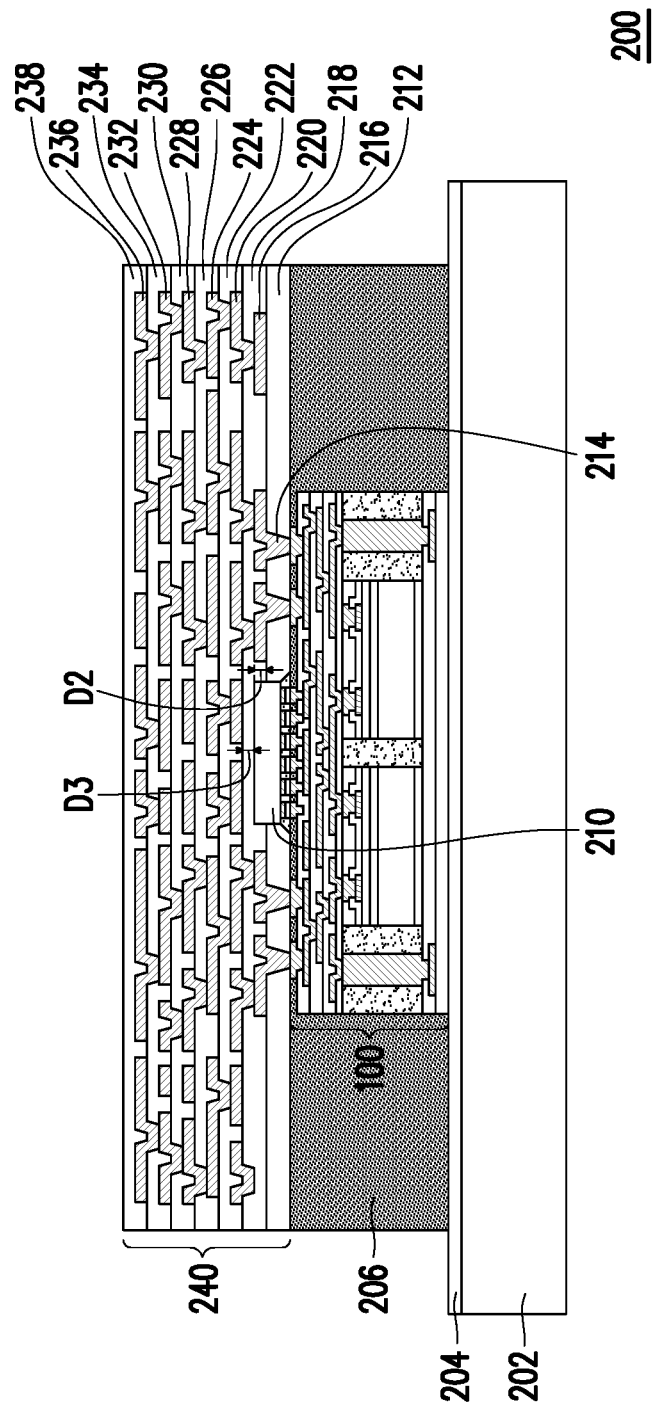

In FIG. 19, the IVR 210 has an upper surface which protrudes above the upper surface of the dielectric layer 212. The IVR 210 may protrude by the distance D2, where D2 is between about 0 µm (level with) and about 50 µm, such as about 15 µm, although other dimensions are contemplated. In such embodiments, the IVR 210 may protrude into multiple dielectric layers of the redistribution structure 240. The distance D3 between the upper surface of the IVR 210 and the top of the next dielectric layer of the redistribution structure 240 may be between about 0 µm (level with) and about 100 µm, such as about 15 µm, although other dimensions are contemplated.

Figure 20:
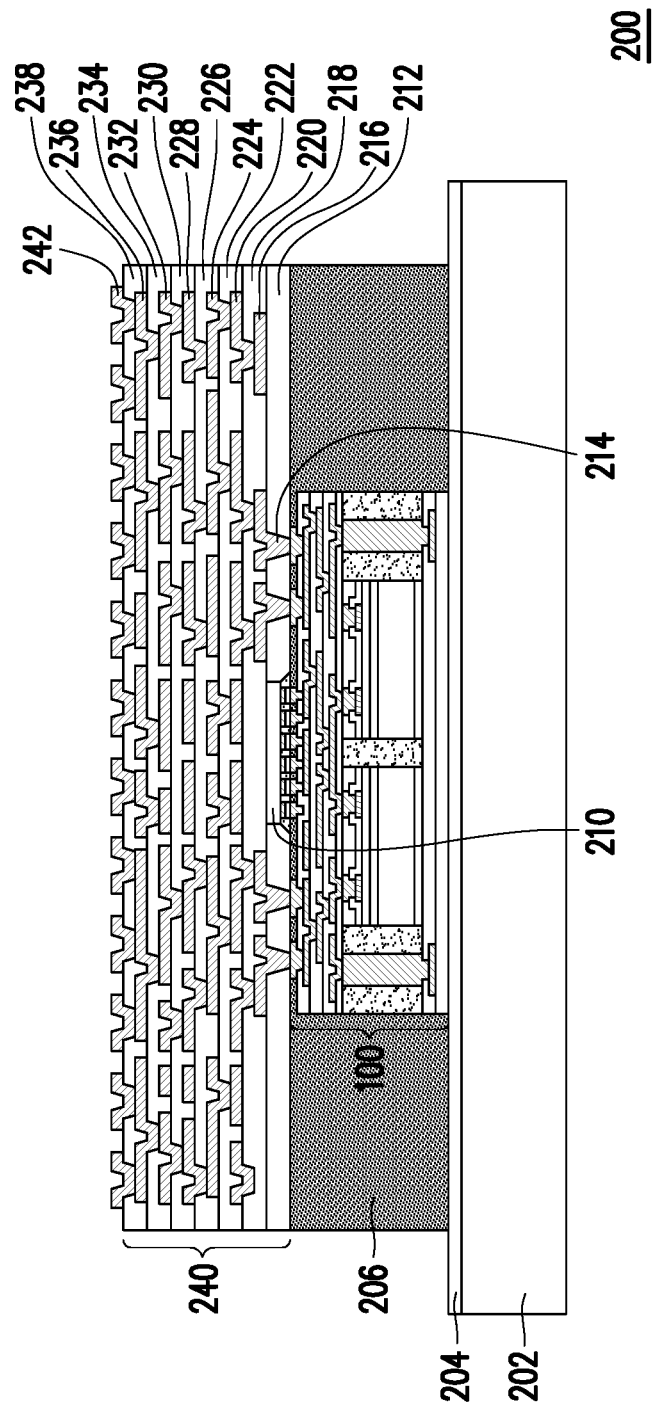

In FIG. 20, under-bump metallurgies (UBMs) 242 are formed for external connection to the redistribution structure 240. The UBMs 242 have bump portions on and extending along the major surface of the dielectric layer 238, and have via portions extending through the dielectric layer 238 to physically and electrically couple the metallization pattern 236. As a result, the UBMs 242 are electrically coupled to the through vias 214 and the first package component 100. The UBMs 242 may be formed of the same material as the metallization pattern 236. In some embodiments, the UBMs 242 has a different size than the metallization patterns 216, 220, 224, 228, 232, and 236. Certain of the UBMs 242 are coupled to the IVR 210 to route high voltage signals to the IVR 210 for regulation and conversion into a low voltage signal to provide to the first package component 100.

Figure 21:
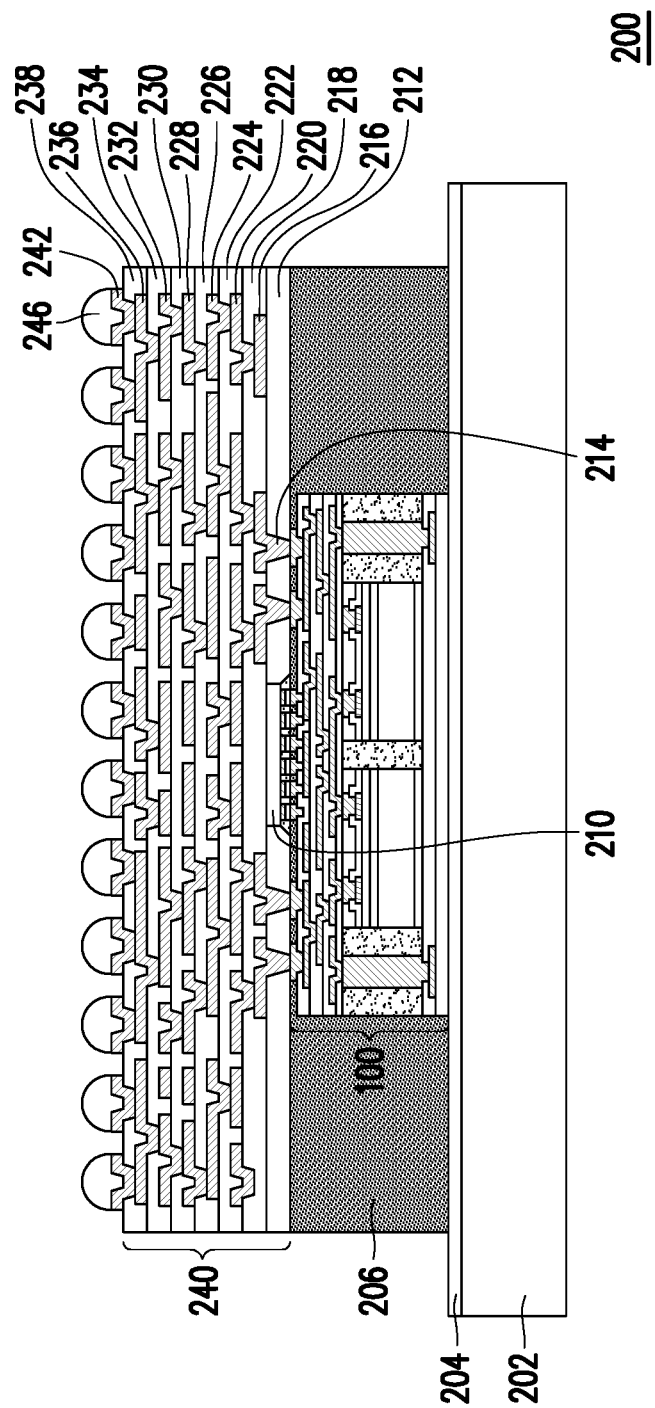

In FIG. 21, conductive connectors 246 are formed on the UBMs 242. The conductive connectors 246 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 246 may include a conductive material such as solder, copper, aluminum, gold, nickel, silver, palladium, tin, the like, or a combination thereof. In some embodiments, the conductive connectors 246 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 246 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 22:
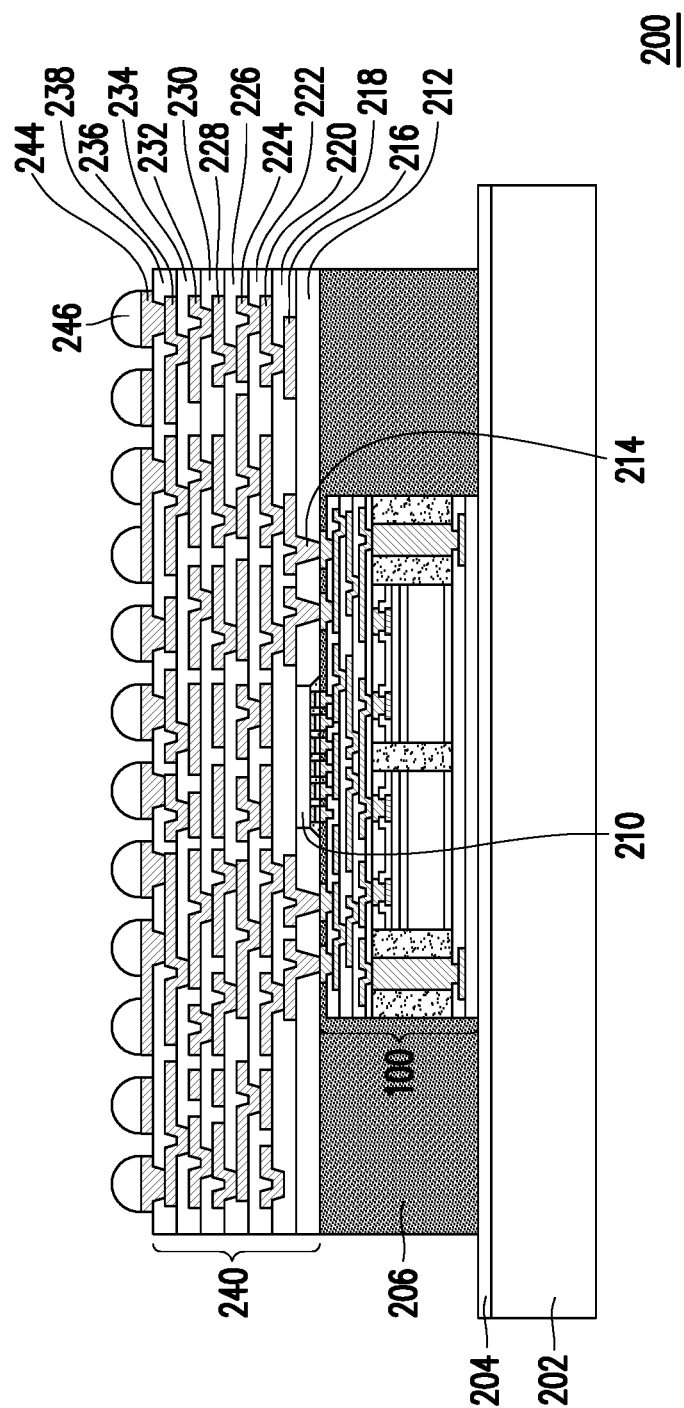

In FIG. 22, rather than forming UBMs 242 a metallization pattern 244 may be formed over the dielectric layer 238, in accordance with some embodiments. The metallization pattern 244 may be formed using materials and processes similar to those described above with respect to metallization pattern 216. The metallization pattern 244 may have areas formed in the pattern which are suited for forming conductive connectors 246 thereon, which may be formed using processes and materials as described above.

Figure 23:
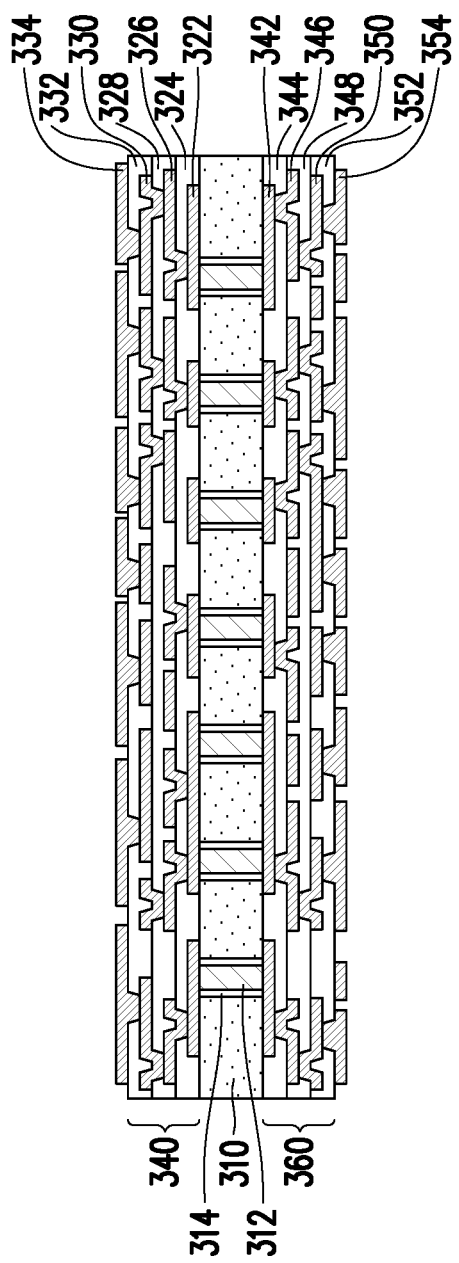
FIGS. 23 through 29 illustrate cross-sectional views of intermediate steps during a process for forming a package component including an embedded integrated voltage regulator, in accordance with some embodiments.
Figure 24:
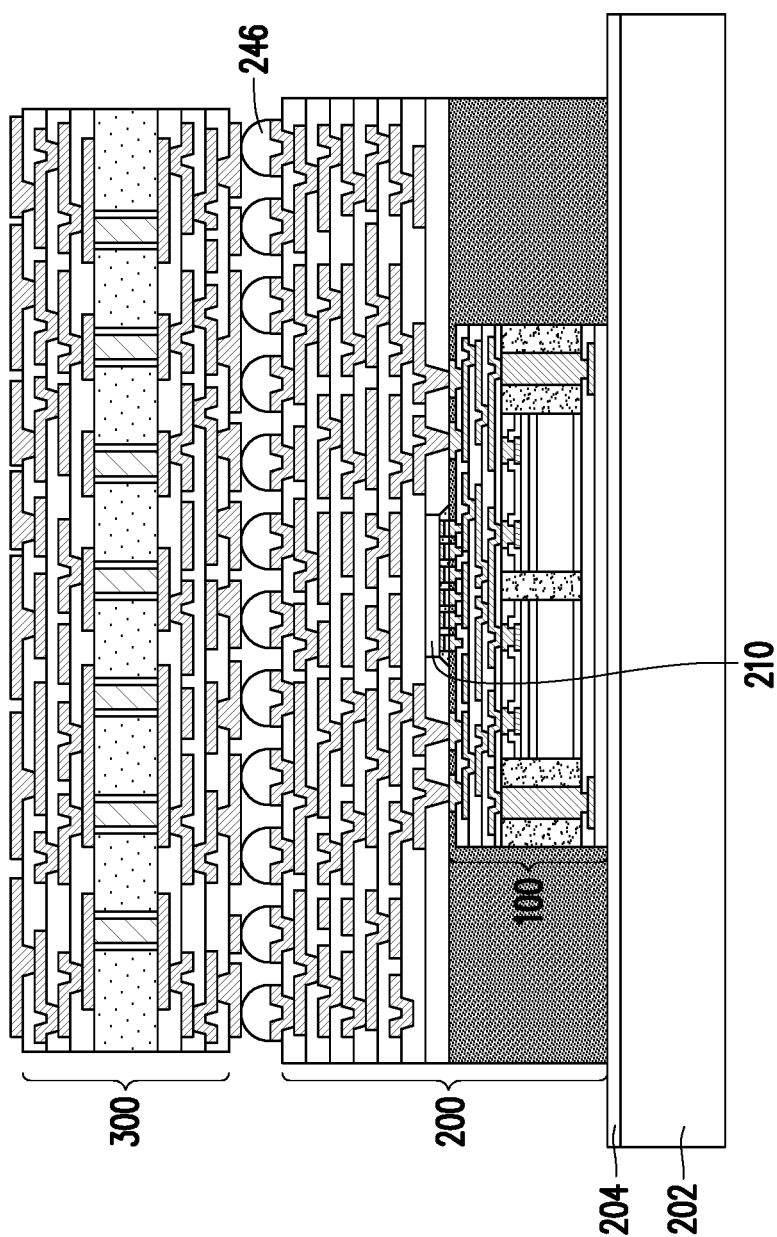

In FIG. 23, a semi-finished substrate 300 (also referred to as substrate 300) is provided and, in FIG. 24, is bonded to the second package component 200. The substrate 300 provides strength and rigidity for the first package components 100. The substrate 300 reduces warpage issues which may result from coefficient of thermal expansion (CTE) mismatch between the different layers of the redistribution structure 240. Without the substrate 300, when the carrier substrate 202 is removed, the second package component 200 would likely suffer from warpage problems. Without the substrate 300, to reduce warpage effects, the redistribution structure 240 may use metallization patterns which mirror one another at each layer so that the left side of the pattern is the same as the right side of the pattern for any particular one of the metallization patterns. However, because the substrate 300 is provided, the substrate core 310 and other layers provides stability and rigidity which prevents warpage, allowing each of the metallization patterns 216, 220, 224, 228, 232, and 236 to vary across the entire layer, which provides more flexibility in pattern routing. In other words, the right side of the metallization patterns may be different than the left side of the metallization pattern, or the right side of the metallization patterns may be asymmetrical to the left side of the metallization pattern.

Utilizing a semi-finished substrate 300 also has the advantage of having the substrate 300 being manufactured in a separate process. Using a separate process to form substrate 300 can lead to greater reliability and higher substrate yield. In addition, because substrate 300 is formed in a separate process, it can be tested separately so that a known good substrate 300 is used in a subsequent process of attaching the substrate 300 to the second package component 200.

The semi-finished substrate 300 may include a substrate core 310 having vias 312 formed therein, and bond pads 322 over the substrate core 310. The substrate 300 may also have bond pads 342 formed on the bottom of the substrate 300. In some embodiments, the vias 312 may be surrounded by a barrier layer 314. The substrate 300 may be formed in a separate process. The substrate core 310 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 310 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate core 310 is, in one alternative embodiment, based on an insulating core such as a fiberglass reinforced resin core. One example core material is fiberglass resin such as FR4 (flame retardant grade 4 material) and the like. Alternatives for the core material include pre-impregnated composite fiber (prepreg), an insulating film or build-up film, paper, glass fiber, non-woven glass fabric, silicon, resin coated copper (RCC), molding material, polyimide, photo image dielectrics (PID), ceramics, glass, bismaleimide-triazine (BT) resin, or alternatively, other printed circuit board (PCB) materials or films. Build up films including laminates and coatings, such as Ajinomoto Build-up Film (ABF) or other laminates may also be used for substrate core 310.

The substrate core 310 may include active and passive devices (not shown), or may be free from either active devices, passive devices, or both. As one of ordinary skill in the art will recognize, a wide variety of devices such as transistors, capacitors, resistors, combinations of these, and the like may be used. The devices may be formed using any suitable methods.

The semi-finished substrate 300 may have a top redistribution structure 340 and/or a bottom redistribution structure 360 formed thereon. The top redistribution structure 340 includes dielectric layers 324, 328, and 332; and metallization patterns 326, 330, and 334. The metallization patterns may also be referred to as redistribution layers or redistribution lines. The top redistribution structure 340 is shown as an example having three layers of metallization patterns in three dielectric layers. More or fewer dielectric layers and metallization patterns may be formed in the top redistribution structure 340.

The dielectric layer 324 may be formed using processes and materials similar to those discussed above with respect to the dielectric layer 212. In addition, the dielectric layer 324 may include prepreg, RCC, molding material, polyimide, a PID, and so forth. The dielectric layer 324 may also be made of one or more lamination layers or coatings. The metallization pattern 326 may be formed using processes and material similar to those discussed above with respect to the metallization pattern 216. Following the formation of the metallization pattern 326, the process of forming a dielectric layer and metallization pattern may be repeated as many times as necessary to form a desired number of layers of the top redistribution structure 340. In the illustrated embodiment, the process of forming dielectric layer 324 and metallization pattern 326 may be repeated to form dielectric layer 328 and metallization pattern 330, then dielectric layer 332 and metallization pattern 334. The dielectric layer 332 is the topmost dielectric layer of the top redistribution structure 340.

The bottom redistribution structure 360 includes dielectric layers 344, 348, and 352; and metallization patterns 346, 350, and 354. The bottom redistribution structure 360 is shown as an example having three layers of metallization patterns in three dielectric layers. More or fewer dielectric layers and metallization patterns may be formed in the bottom redistribution structure 360.

The bottom redistribution structure 360 of substrate 300 may be formed by flipping the substrate 300 over and forming the bottom redistribution structure 360 using processes and materials similar to those discussed above with respect to the top redistribution structure 340. In particular, the dielectric layers 344, 348, and 352 may be formed similar to the dielectric layers 324, 328, and 332, respectively. Likewise, the metallization patterns 346, 350, and 354 may be formed similar to the metallization patterns 326, 330, and 334, respectively.

In FIG. 24, the substrate 300 is bonded to the second package component 200 by the conductive connectors 246 to form package 400. In some embodiments, the substrate 300 may be placed on the conductive connectors 246 using a pick and place process or another suitable process and bonded to the conductive connectors 246 by flip chip bonding process or other suitable bonding process. In some embodiments, the conductive connectors 246 are reflowed to attach the substrate 300 to the second package component 200 by way of metallization pattern 354. The conductive connectors 246 electrically and/or physically couple the substrate 300 to the second package component 200.

The conductive connectors 246 may have an epoxy flux (not shown) formed thereon before they are reflowed with at least some of the epoxy portion of the epoxy flux remaining after the semi-finished substrate 300 is attached to the second package component 200. This remaining epoxy portion may act as an underfill to reduce stress and protect the joints resulting from the reflowing the conductive connectors 246. In some embodiments, an underfill (not shown) may be formed between the substrate 300 and second package component 200 and surrounding the conductive connectors 246. The underfill may be formed by a capillary flow process after the substrate 300 is attached or may be formed by a suitable deposition method before the substrate 300 is attached.

In some embodiments, passive devices (e.g., surface mount devices (SMDs), not illustrated) may also be attached to the first package component 100 (e.g., to the contact pads 140) or to the second package component 200 (e.g., to the UBMs 242) or to the substrate 300 (e.g., to bond pads associated with metallization pattern 334 or metallization pattern 354). The passive devices may be attached to the first package component 100 prior to forming the redistribution structure 240 thereon to form the second package component 200, or may be attached to the second package component 200 prior to attaching the substrate 300, or may be attached prior to or after mounting the substrate 300 to the second package component 200.

Figure 25:
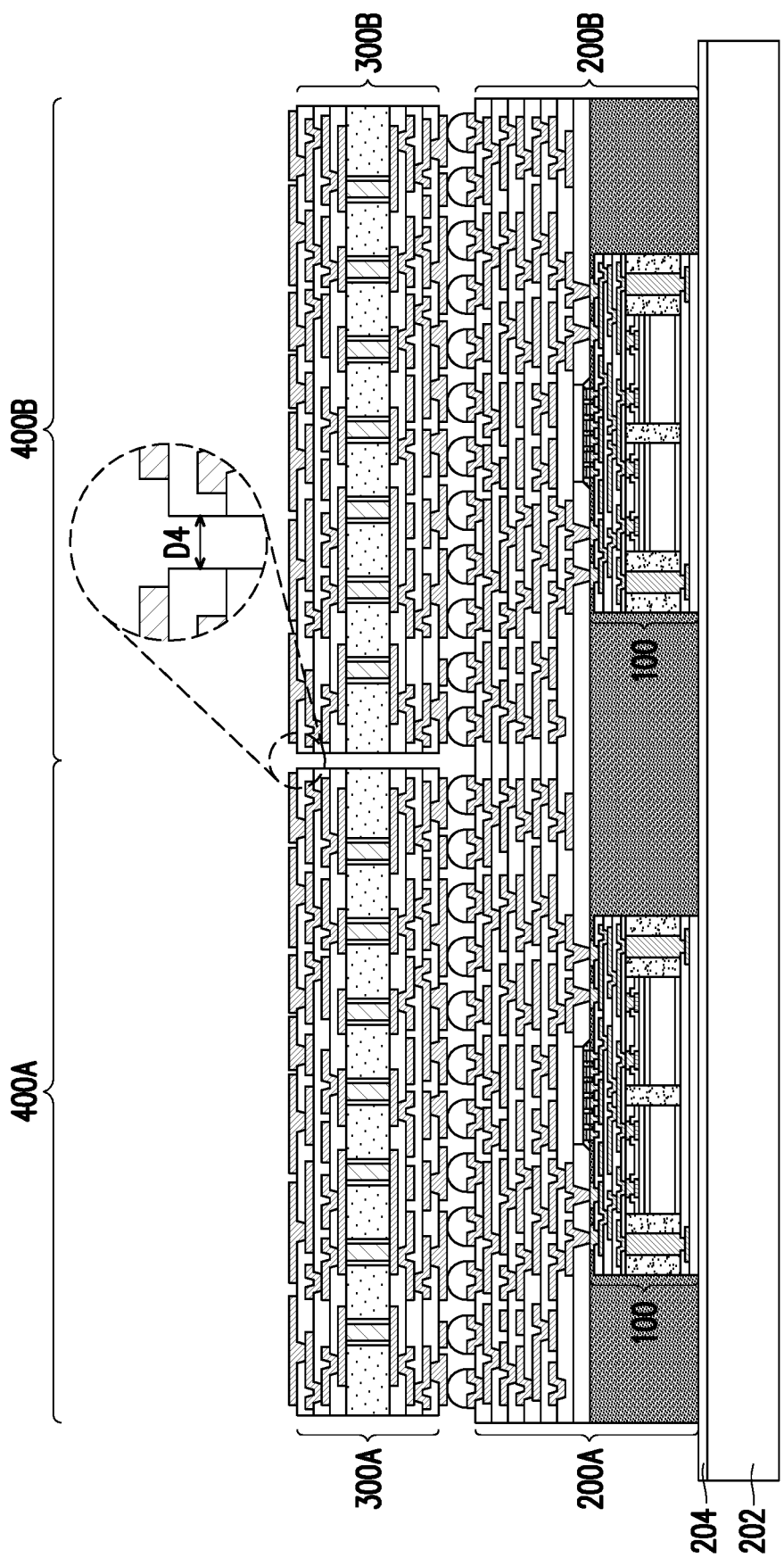

In FIG. 25, multiple ones of package 400 (e.g., packages 400A and 400B) are illustrated as being formed on carrier substrate 202 and are later singulated into individual packages. It should be understood that additional such packages may be formed on the carrier substrate 202. An enlarged area is illustrated where the substrate 300A of package 400A is adjacent to the substrate 300B of package 400B. The substrate 300A is separated from the adjacent substrate 300B by a distance D4 between about 25 µm and about 1,000 µm, such as about 500 µm. This distance provides space for singulation of package 400A from package 400B. As a result of the formation process of package 400A and package 400B, each of the substrates 300A and 300B will be respectively smaller than the second package components 200A and 200B. In other words, package 400 will result in a substrate which is not as wide as the package component attached thereto. This will be shown in the further discussion below.

Figure 26:
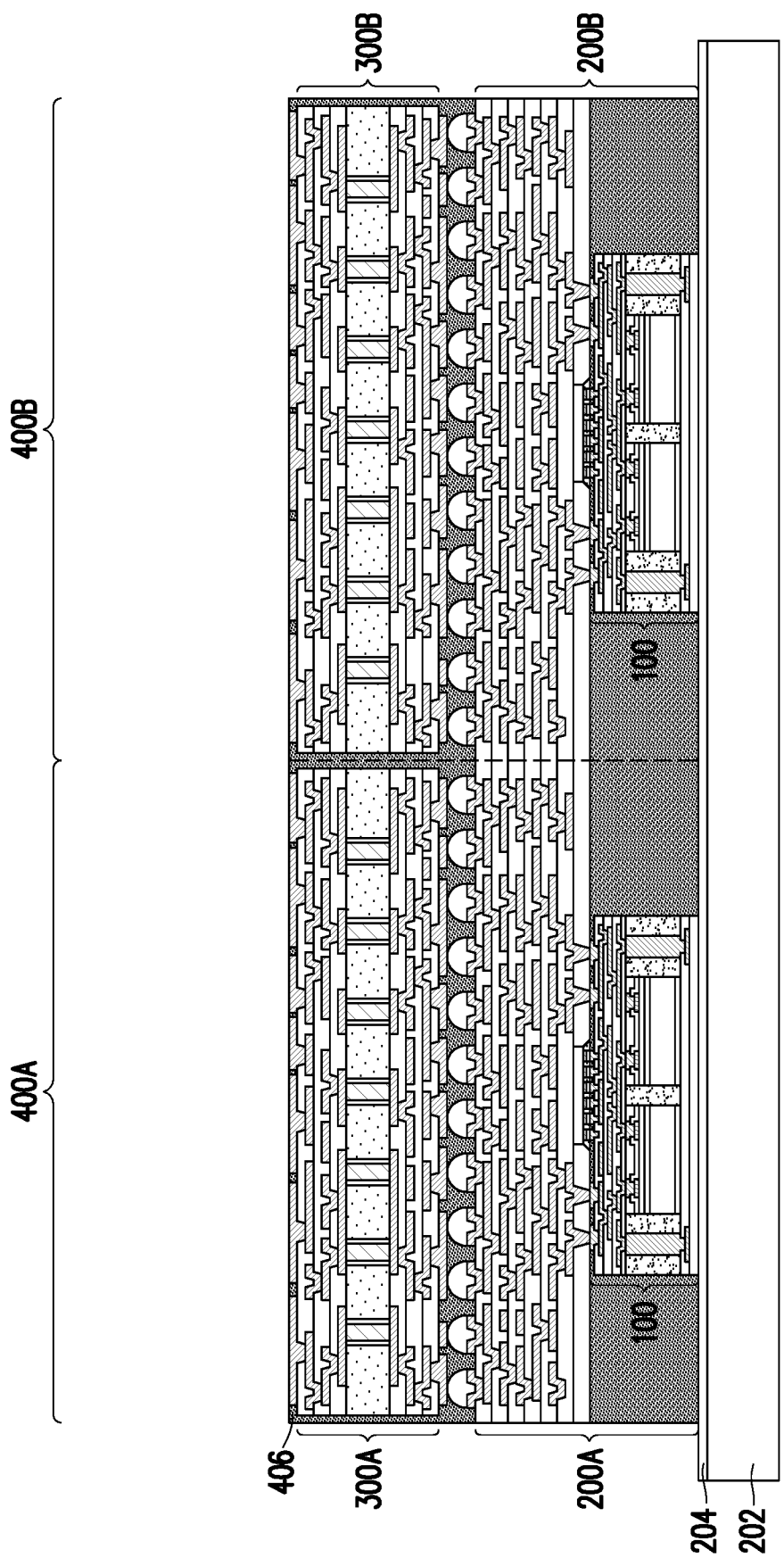

In FIG. 26, an encapsulant 406 is formed on, around, and between the substrates 300A and 300B. After formation, the encapsulant 406 encapsulates the substrates 300A and 300B. The encapsulant 406 may be a molding compound, epoxy, or the like. The encapsulant 406 may be applied by compression molding, transfer molding, or the like, and may be formed over the carrier substrate 202 such that the semi-finished substrates 300A and 300B are buried or covered. The encapsulant 406 is further formed between the semi-finished substrates 300A and respective second package components 200A and 200B. The encapsulant 406 may be applied in liquid or semi-liquid form and then subsequently cured. Following the formation of the encapsulant 406, a planarization process is performed on the encapsulant 406 to expose the metallization pattern 334 (see FIG. 23). Top surfaces of the metallization pattern 334 and encapsulant 406 are coplanar after the planarization process. The planarization process may be, for example, a chemical-mechanical polish (CMP), a grinding process, or the like. In some embodiments, the planarization may be omitted, for example, if the metallization pattern 334 is already exposed. Other processes may be used to achieve a similar result. For example, a dielectric or passivation layer may be formed over the metallization pattern 334 prior to forming the encapsulant 406. In such cases, the dielectric or passivation layer may be patterned in a subsequent step to expose portions of the metallization pattern 334.

Figure 27:
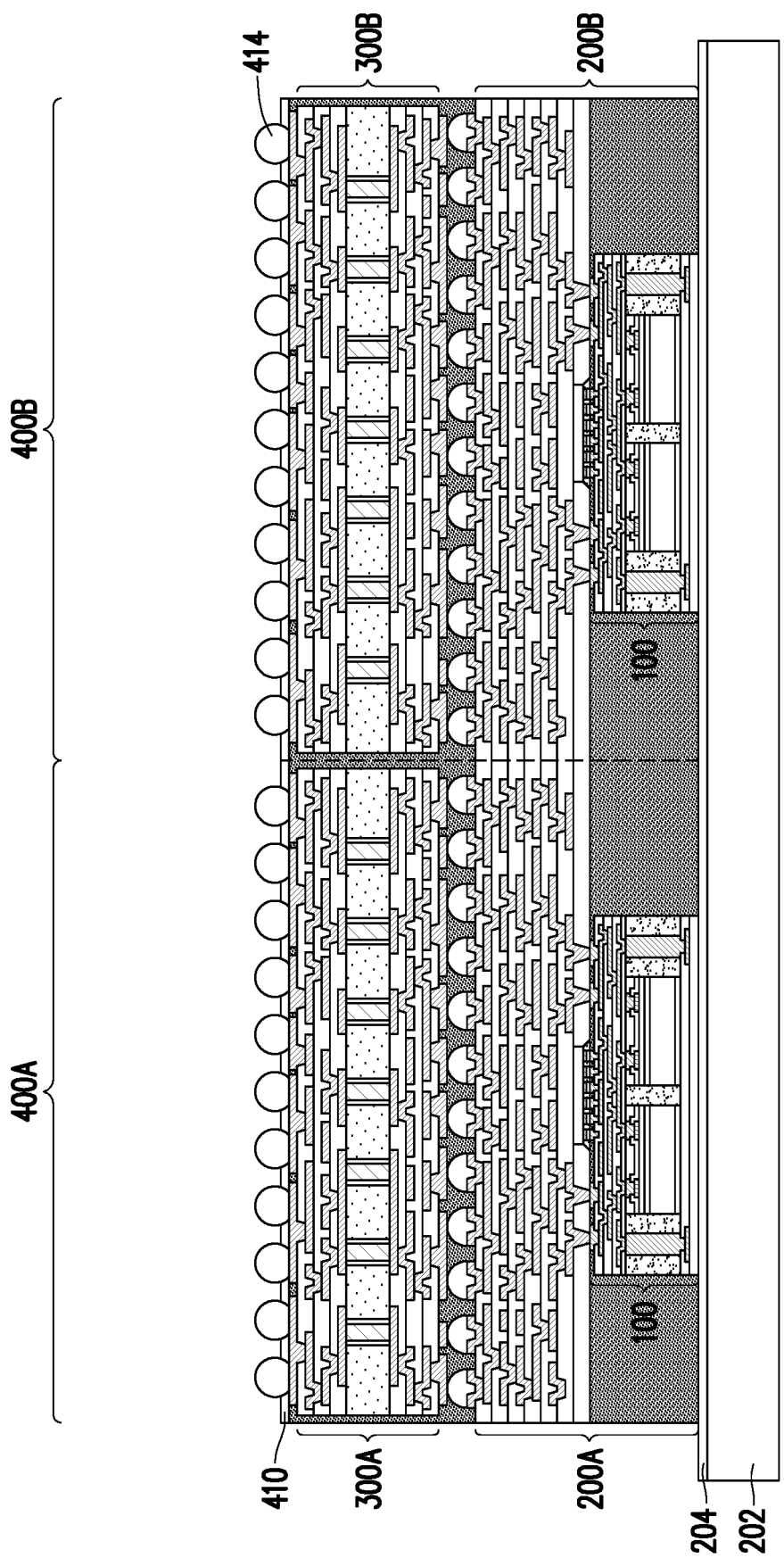

In FIG. 27, a dielectric layer 410 is formed over the semi-finished substrates 300A and 300B. In some embodiments, the dielectric layer 410 is a solder resist and may be formed of a polymer, which may be a photo-sensitive material such as PBO, polyimide, BCB, or the like, that may be patterned using a lithography mask. In other embodiments, the dielectric layer 410 is formed of a nitride such as silicon nitride; an oxide such as silicon oxide, PSG, BSG, BPSG; or the like. The dielectric layer 410 may be formed by spin coating, lamination, CVD, the like, or a combination thereof. The dielectric layer 410 is then patterned to form openings exposing portions of the metallization pattern 334 (see FIG. 23), the openings corresponding to connector locations, for example of a ball grid array which is subsequently formed. The patterning may be formed by an acceptable process, such as by exposing the dielectric layer 410 to light when the dielectric layer 410 is a photo-sensitive material or by etching using, for example, an anisotropic etch. If the dielectric layer 410 is a photo-sensitive material, the dielectric layer 410 can be developed after the exposure.

Conductive connectors 414 are formed in the openings of the dielectric layer 410. In some embodiments, under-bump metallurgies (for example, similar to UBMs 242) may be formed prior to forming the conductive connectors 414. In other embodiments, the conductive connectors 414 may be formed on the exposed portions of the metallization pattern 334. The conductive connectors 414 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 414 may include a conductive material such as solder, copper, aluminum, gold, nickel, silver, palladium, tin, the like, or a combination thereof. In some embodiments, the conductive connectors 414 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 414 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 28:
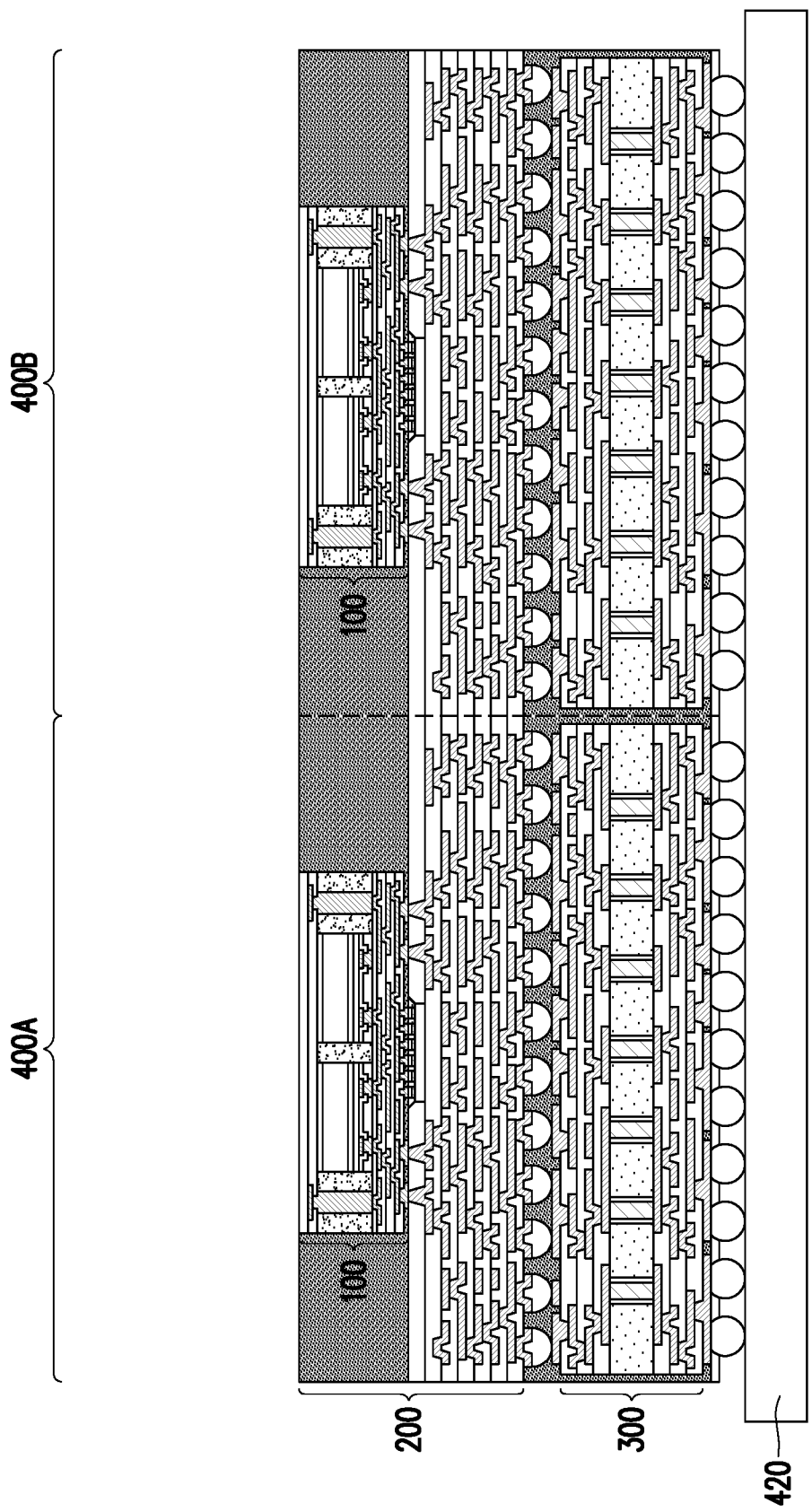

In FIG. 28, a carrier substrate de-bonding is performed to detach (or "de-bond") the carrier substrate 202 (see FIG. 27) from the second package components 200, e.g., second package components 200A and 200B. In accordance with some embodiments, the de-bonding includes projecting a light such as a laser light or an UV light on the release layer 204 so that the release layer 204 decomposes under the heat of the light and the carrier substrate 202 can be removed. The structure is then flipped over and placed on a tape 420, such as a blue tape for singulation.

Figure 29:
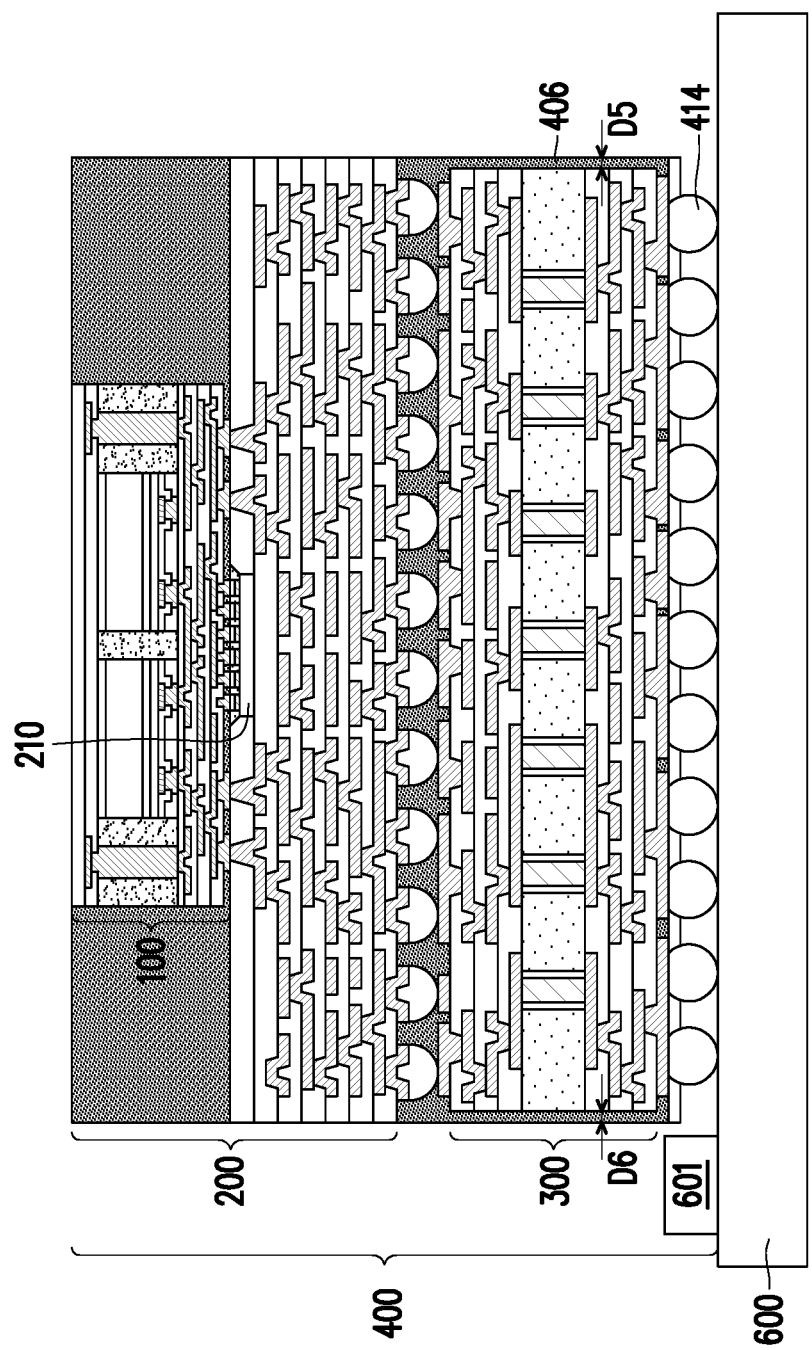

In FIG. 29, in some embodiments, a singulation process is performed by sawing along scribe line regions, e.g., between the package 400A and the package 400B. The sawing singulates the package 400A from the package 400B. The resulting, singulated package 400 is from one of the package 400A or the package 400B.

Each singulated package 400 is then mounted to a printed circuit board 600 using the conductive connectors 414. The printed circuit board 600 may include active and passive components as well as other devices. In some embodiments the printed circuit board 600 may be an interposer or another package component. The printed circuit board 600 may include a voltage source device 601 mounted thereto which provides a high voltage signal to conductive connectors 414, which is then routed through the substrate 300 to various components.

As illustrated in FIG. 29, due to the processing techniques, a width D5 and a width D6 of the encapsulant 406 remains on each respective side of the semi-finished substrate 300. The other sides of the semi-finished substrate 300 may have a similar remaining amount of the encapsulant 406 on the sides. The widths D5 and D6 may be greater than 0 up to about 500 µm, for example between about 5 µm and about 500 µm, such as about 250 µm, though other values are contemplated. In some embodiments, the widths of the encapsulant 406 may be uniform on each side of the semi-finished substrate 300. In other embodiments, the widths of the encapsulant 406 may be different on each side of the substrate 300. In this manner, the width of the semi-finished substrate 300 is smaller than the width of the second package component 200 by the combined total of D5 and D6. In other terms, the redistribution structure 240 is wider than the substrate 300. In yet other terms, the substrate has a smaller footprint than the second package component 200, which it supports.

In some embodiments, the conductive connectors 414 are reflowed to attach the package 400 to corresponding bond pads of printed circuit board 600. The conductive connectors 414 electrically and/or physically couple the printed circuit board 600 to the package 400.

The conductive connectors 414 may have an epoxy flux (not shown) formed thereon before they are reflowed with at least some of the epoxy portion of the epoxy flux remaining after the package 400 is attached to the printed circuit board 600. This remaining epoxy portion may act as an underfill to reduce stress and protect the joints resulting from the reflowing the conductive connectors 414.

It should be appreciated that the package 400 may be implemented in other device stacks. For example, a PoP structure is shown, but the package 400 may also be implemented in a Flip Chip Ball Grid Array (FCBGA) package. In such embodiments, the package 400 may be mounted to a substrate such as the printed circuit board 600. A lid or heat spreader may be attached to the package 400.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 30:
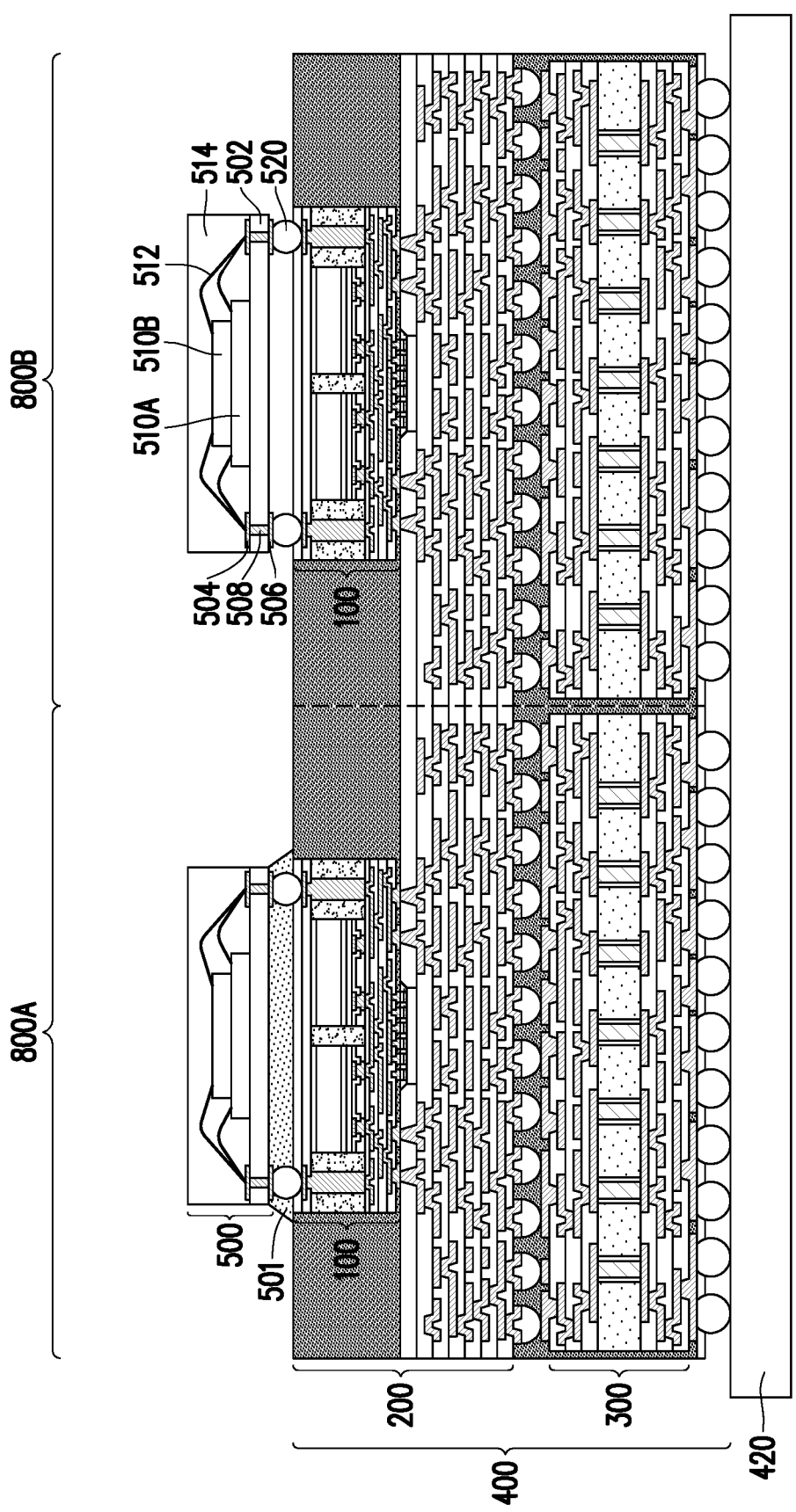
FIGS. 30 through 31 illustrate cross-sectional views of intermediate steps during a process for forming a package component including an embedded integrated voltage regulator, in accordance with some embodiments.

In FIG. 30, in some embodiments, third package components 500 are coupled to the first package components 100 of the package 400 to form the package 800. One of the third package components 500 are coupled in each of the packages 800A and 800B to form an integrated circuit device stack in each region of the first package components 100. In such embodiments, third package components 500 may be coupled to the first package components 100 prior to singulation or after singulation of the first package components 100 (see FIG. 10) or prior to singulation or after singulation of the second package components 200 (see FIG. 29). For example, the carrier substrate 202 may be removed and the packages 400 flipped over and placed on a tape 440 (see FIG. 28). Then the third package components 500 may be attached. In embodiments which do not use the third package components 500, the back-side redistribution structure 106 and through vias 116 may be omitted.

The third package components 500 include a substrate 502 and one or more stacked dies 510 (e.g., dies 510A and 510B) coupled to the substrate 502. Although one set of stacked dies 510 (510A and 510B) is illustrated, in other embodiments, a plurality of stacked dies 510 (each having one or more stacked dies) may be disposed side-by-side coupled to a same surface of the substrate 502. The substrate 502 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 502 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 502 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 502.

The substrate 502 may include active and passive devices (not shown). A wide variety of devices such as transistors, capacitors, resistors, combinations of these, and the like may be used to generate the structural and functional requirements of the design for the third package components 500. The devices may be formed using any suitable methods.

The substrate 502 may also include metallization layers (not shown) and conductive vias 508. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 502 is substantially free of active and passive devices.

The substrate 502 may have bond pads 504 on a first side of the substrate 502 to couple to the stacked dies 510, and bond pads 506 on a second side of the substrate 502, the second side being opposite the first side of the substrate 502, to couple to the conductive connectors 520. In some embodiments, the bond pads 504 and 506 are formed by forming recesses (not shown) into dielectric layers (not shown) on the first and second sides of the substrate 502. The recesses may be formed to allow the bond pads 504 and 506 to be embedded into the dielectric layers. In other embodiments, the recesses are omitted as the bond pads 504 and 506 may be formed on the dielectric layer. In some embodiments, the bond pads 504 and 506 include a thin seed layer (not shown)

made of copper, titanium, nickel, gold, palladium, the like, or a combination thereof. The conductive material of the bond pads 504 and 506 may be deposited over the thin seed layer. The conductive material may be formed by an electrochemical plating process, an electroless plating process, CVD, atomic layer deposition (ALD), PVD, the like, or a combination thereof. In an embodiment, the conductive material of the bond pads 504 and 506 is copper, tungsten, aluminum, silver, gold, the like, or a combination thereof.

In an embodiment, the bond pads 504 and bond pads 506 are UBMs that include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the bond pads 504 and 506. Any suitable materials or layers of material that may be used for the bond pads 504 and 506 are fully intended to be included within the scope of the current application. In some embodiments, the conductive vias 508 extend through the substrate 502 and couple at least one of the bond pads 504 to at least one of the bond pads 506.

In the illustrated embodiment, the stacked dies 510 are coupled to the substrate 502 by wire bonds 512, although other connections may be used, such as conductive bumps. In an embodiment, the stacked dies 510 are stacked memory dies. For example, the stacked dies 510 may be memory dies such as low-power (LP) double data rate (DDR) memory modules, such as LPDDR1, LPDDR2, LPDDR3, LPDDR4, or the like memory modules.

The stacked dies 510 and the wire bonds 512 may be encapsulated by a molding material 514. The molding material 514 may be molded on the stacked dies 510 and the wire bonds 512, for example, using compression molding. In some embodiments, the molding material 514 is a molding compound, a polymer, an epoxy, silicon oxide filler material, the like, or a combination thereof. A curing process may be performed to cure the molding material 514; the curing process may be a thermal curing, a UV curing, the like, or a combination thereof.

In some embodiments, the stacked dies 510 and the wire bonds 512 are buried in the molding material 514, and after the curing of the molding material 514, a planarization step, such as a grinding, is performed to remove excess portions of the molding material 514 and provide a substantially planar surface for the third package components 500.

After the third package components 500 are formed, the third package components 500 are mechanically and electrically bonded to the first package components 100 by way of the conductive connectors 520, the bond pads 506, and a metallization pattern of the back-side redistribution structure 106 (see FIG. 3). In some embodiments, the stacked dies 510 may be coupled to the integrated circuit dies 50A and 50B (see FIG. 5) and/or IVR 210 (see FIG. 17) through the wire bonds 512, the bond pads 504 and 506, conductive vias 508, the conductive connectors 520, the back-side redistribution structure 106, the through vias 116, and the front-side redistribution structure 122.

In some embodiments, a solder resist is formed on the side of the substrate 502 opposing the stacked dies 510. The conductive connectors 520 may be disposed in openings in the solder resist to be electrically and mechanically coupled to conductive features (e.g., the bond pads 506) in the substrate 502. The solder resist may be used to protect areas of the substrate 502 from external damage.

In some embodiments, the conductive connectors 520 have an epoxy flux (not shown) formed thereon before they are reflowed with at least some of the epoxy portion of the epoxy flux remaining after the third package components 500 are respectively attached to the first package components 100.

In some embodiments, an underfill 501 (shown for example purposes applied to the left illustrated third package component 500 and omitted on the right illustrated third package component 500) is formed between the first package component 100 and the third package components 500, surrounding the conductive connectors 520. The underfill 501 may reduce stress and protect the joints resulting from the reflowing of the conductive connectors 520. The underfill 501 may be formed by a capillary flow process after the third package components 500 are attached, or may be formed by a suitable deposition method before the third package components 500 are attached. In embodiments where the epoxy flux is formed, it may act as the underfill 501.

Figure 31:
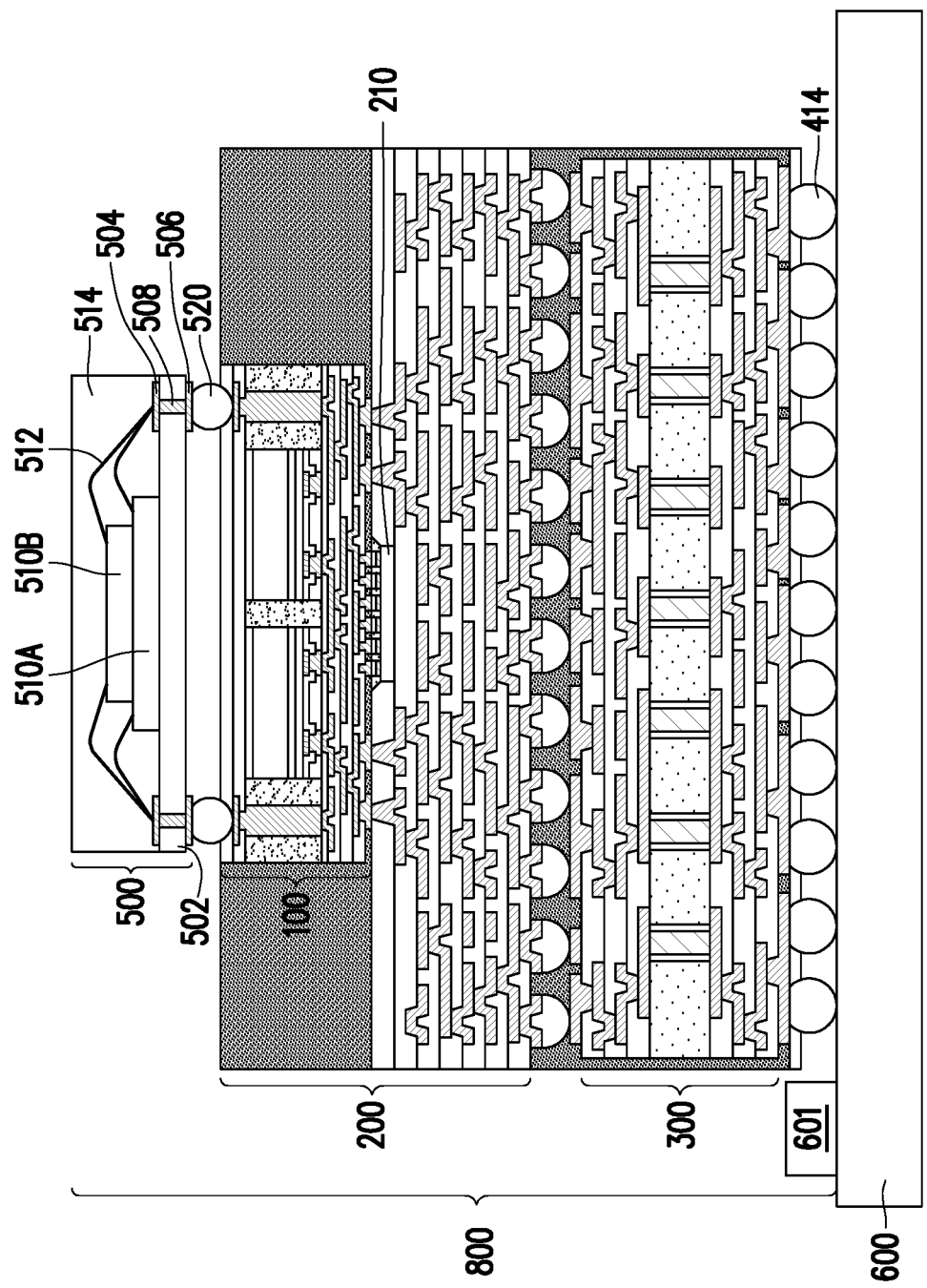

In FIG. 31, in some embodiments, a singulation process is performed by sawing along scribe line regions, e.g., between the package 800A and the package 800B (see FIG. 30). The sawing singulates the package 800A from the package 800B. The resulting, singulated package 800 is from one of the package 800A or the package 800B.

Each singulated package 800 is then mounted to a printed circuit board 600 using the conductive connectors 414, in accordance with some embodiments. The printed circuit board 600 may include active and passive components as well as other devices. In some embodiments the printed circuit board 600 may be an interposer or another package component. The printed circuit board 600 may include a voltage source device 601 mounted thereto which provides a high voltage signal to conductive connectors 414, which is then routed through the substrate 300 to various components. In some embodiments, the conductive connectors 414 are reflowed to attach the package 800 to corresponding bond pads of printed circuit board 600 to form device 900. The conductive connectors 414 electrically and/or physically couple the printed circuit board 600 to the package 800, such as discussed above with respect to FIG. 29.

Figure 32:
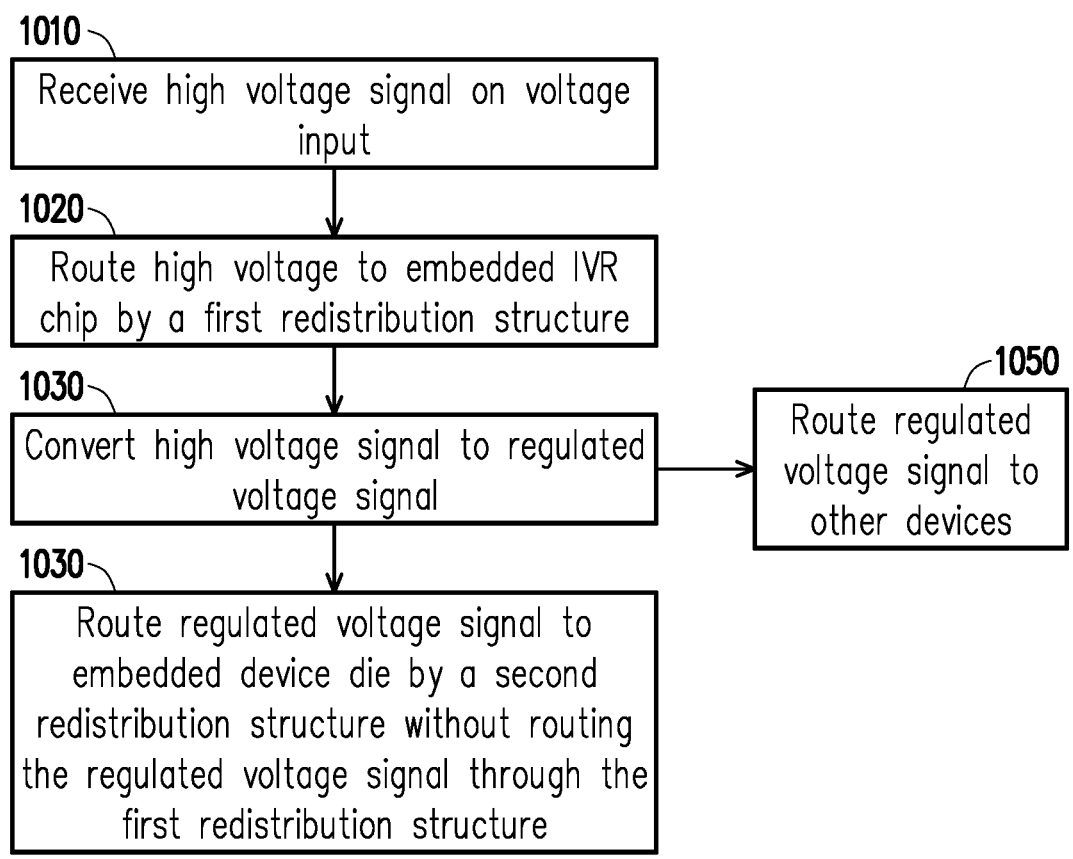
FIG. 32 is a flow diagram illustrating a process flow for regulating a voltage provided to a device die, in accordance with some embodiments.

In FIG. 32, a flow diagram is provided which illustrates an operation of a structure, in accordance with some embodiments, such as embodiments described above with respect to package 400 or package 800. The flow of FIG. 32 is discussed below with respect to the package 400, however, it should be understood that this flow could be applied in general to all contemplated embodiments. At 1010, a high voltage signal (e.g., from voltage source device 601) is received on a voltage input. The voltage input may be received, for example, at one of the conductive connectors 414 (see FIG. 29) or at one of the conductive connectors 246 (see FIG. 24). In some embodiments, the high voltage signal may have a nominal value of about 5 V or about 12 V, a current of between about 4 A and about 15 A, for a total power between about 20 W and about 120 W, such as about 40 W, although other values are contemplated and may be used. At 1020, the high voltage signal is routed to an embedded IVR, for example, IVR 210 (see FIG. 29), by a first redistribution structure, for example, redistribution structure 240 (see FIG. 22). In some embodiments a total ohmic load through redistribution structure 240 may be between about $0.05\Omega$ and about $10\Omega$, such as about $0.1\Omega$, though other values are contemplated.

At 1030, the high voltage signal is converted to a regulated voltage signal by the IVR. The magnitude of the regulated voltage signal is less than the magnitude of the high voltage signal. In some embodiments, the regulated voltage signal may be between about 0.1 V and about 2.5 V, such as about 0.7 V and the current for the regulated voltage signal may be between about 10 A and about 200 A, such as about 58 A. Other values for the regulated voltage output are contemplated and may be used. In some embodiments, a ratio of the regulated voltage output to the high voltage signal may be between about 10% and about 20%, although other values are contemplated and may be used. At 1040, the regulated voltage signal is routed to an embedded device die by a second redistribution structure without routing the regulated voltage signal through the first redistribution structure. For example, the regulated voltage signal from IVR 210 is routed by the front-side redistribution structure 122 (see FIG. 12) to the embedded integrated circuit dies 50A and/or 50B (see FIG. 5). In some embodiments a total ohmic load through the second redistribution structure (such as redistribution structure 122) may be between about 0.05Ω and about 10Ω, such as about 0.1Ω, though other values are contemplated. A total voltage drop for a regulated voltage of 0.7 V may be between about 9 mV and about 14 mV, though other values are contemplated. At 1050, optionally in some embodiments, the regulated voltage signal can be routed to other devices, which may include routing the regulated voltage signal back through the first redistribution structure to the other devices.

By incorporating an embedded IVR close to the device dies of a package, the path from the output of the IVR to the device dies can be shortened to reduce IR drop and provide more consistent voltage output from the IVR to the device die. By forming an embedded die and attaching the IVR to the embedded die, the IVR is embedded in a redistribution structure for the package. The IVR may also be embedded between two different redistribution structures—one being an interconnect for the package component having the embedded device dies and another being for distributing signals between the package component and other devices or packages. The IVR may also be aligned with one or more regulated voltage pin inputs of the embedded device dies to provide a short signal from a regulated voltage pin output of the IVR to the regulated voltage pin input of the embedded device dies. The use of a semi-finished substrate provides rigidity for the final device, lowers costs, and improves reliability and yield. The build process for the device may proceed on a support carrier and then transfer support to the later attached semi-finished substrate. Because the semi-finished substrates are spaced across the devices in the build process, the final substrate is actually narrower than the redistribution structure which it supports. Other devices or packages may also be attached to the device to provide additional functionality. The process of embedding the integrated user die, attaching the IVR, forming a redistribution structure over the IVR, and attaching a semi-finished substrate may be performed in a one-stop-shop like process flow, thereby decreasing production costs.

In one embodiment, a method includes attaching a voltage regulator to a first redistribution structure of a first package. A second redistribution structure is formed over the voltage regulator, the voltage regulator being embedded in the second redistribution structure. The first substrate is attached to the second redistribution structure to form a second package including the first package. In an embodiment, the method further includes forming an encapsulant over and around the first substrate and singulating the second package, where following the singulation the encapsulant remains on sidewalls of the first substrate. In an embodiment, the method further includes attaching the first substrate to a printed circuit board to form a first device. In an embodiment, the method further includes that the voltage regulator is within lateral extents of the first redistribution structure. In an embodiment, the method further includes that lateral extents of the second redistribution structure are greater than lateral extents of the first substrate. In an embodiment, the method further includes routing a first voltage signal to the voltage regulator through the second redistribution structure, regulating the first voltage signal to a second voltage signal, the second voltage signal having a voltage magnitude which is less than the first voltage signal, and routing the second voltage signal to a device die of the first package through the first redistribution structure without routing the second voltage signal through the second redistribution structure. In an embodiment, attaching the voltage regulator to the first redistribution structure includes bonding connectors of the voltage regulator to corresponding contact pads of the first redistribution structure In another embodiment, a method includes providing a first voltage to a first redistribution structure of a structure. The first voltage is provided through the first redistribution structure to a voltage regulator. The voltage regulator regulates the first voltage into a second voltage. The second voltage is provided from the voltage regulator through a second redistribution structure to a first device die, where an output of the voltage regulator is attached directly to the second redistribution structure. In an embodiment, the method further includes providing the second voltage to a second device die, where the first device die corresponds to a system die and the second device die corresponds to a memory die. In an embodiment, the method further includes that the output of the voltage regulator is within lateral extents of the first device die. In an embodiment, the method further includes that the voltage regulator has a back surface opposite the output, the back surface being embedded within the first redistribution structure.

In yet another embodiment, a structure includes a substrate and a first redistribution structure disposed over the substrate. A voltage regulator is disposed over the first redistribution structure, where connectors of the voltage regulator face away from the first redistribution structure. A second redistribution structure is disposed over the voltage regulator, where the voltage regulator is disposed within lateral extents of the second redistribution structure. A device die is disposed over the second redistribution structure, where the second redistribution structure electrically couples an output of the voltage regulator to an input of the device die. In an embodiment, the structure further includes a first encapsulant surrounding the substrate. In an embodiment, the structure further includes that lateral extents of the substrate are smaller than lateral extents of the first redistribution structure. In an embodiment, the structure further includes a plurality of connectors interposed between the substrate and the first redistribution structure, the plurality of connectors coupling the substrate to the first redistribution structure. In an embodiment, the structure further includes an underfill interposed between the voltage regulator and the second redistribution structure. In an embodiment, the structure further includes that the voltage regulator is embedded in the first redistribution structure. In an embodiment, the structure further includes that the voltage regulator is embedded in two or more layers of the first redistribution structure. In an embodiment, the structure further includes that a metallization pattern of the first redistribution structure is asymmetrical. In an embodiment, the structure further includes a package disposed over the device die, a third redistribution structure interposed between the package and the device die, and one or more vias coupling the third redistribution structure to the second redistribution structure.

In still another embodiment, a method includes attaching a first device to a carrier substrate. The first device is laterally encapsulated in a first encapsulant and contact pads of the first device are exposed from the first encapsulant. A second device is attached to the contact pads. A first redistribution structure is formed over the first device and first encapsulant, where the first redistribution structure embeds the second device in one or more layers of the first redistribution structure. A prepared substrate is provided and attached to the first redistribution structure opposite the second device. In an embodiment, the method further includes removing the carrier substrate, and singulating a first package from a second package, the first package including the first device and prepared substrate, where dimensions of the prepared substrate is the same before and after singulation. In an embodiment, the method further includes laterally encapsulating the prepared substrate in a second encapsulant, and forming connectors over the prepared substrate, wherein after singulation the second encapsulant covers sidewalls of the prepared substrate. In an embodiment, the method further includes that the second device is within lateral extents of the first device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
attaching a voltage regulator to a first redistribution structure of a first package;
forming a second redistribution structure over the voltage regulator, the voltage regulator being embedded in the second redistribution structure; and
attaching a first substrate to the second redistribution structure to form a second package including the first package, wherein lateral extents of the second redistribution structure are greater than lateral extents of the first substrate.

2. The method of claim 1, further comprising:
forming an encapsulant over and around the first substrate; and
singulating the second package, wherein following the singulation the encapsulant remains on sidewalls of the first substrate.

3. The method of claim 1, further comprising:
attaching the first substrate to a printed circuit board to form a first device.

4. The method of claim 1, wherein the voltage regulator is within lateral extents of the first redistribution structure.

5. The method of claim 1, further comprising:
routing a first voltage signal to the voltage regulator through the second redistribution structure;
regulating the first voltage signal to a second voltage signal, the second voltage signal having a voltage magnitude which is less than the first voltage signal; and
routing the second voltage signal to a device die of the first package through the first redistribution structure without routing the second voltage signal through the second redistribution structure.

6. The method of claim 1, wherein attaching the voltage regulator to the first redistribution structure comprises bonding connectors of the voltage regulator to corresponding contact pads of the first redistribution structure.

7. The method of claim 6, the contact pads of the first redistribution structure are laterally surrounded by an encapsulant, the encapsulant extending continuously over a side of the first redistribution structure.

8. A method comprising:
attaching a first device to a carrier substrate, the first device being an integrated fan out package, the integrated fan out package comprising a first embedded die laterally surrounded by a first encapsulant, and a fan-out interconnect disposed over the first encapsulant;
laterally encapsulating the first device in a second encapsulant, wherein the second encapsulant is formed on sidewalls of the fan-out interconnect;
exposing contact pads of the first device from the second encapsulant;
attaching a second device to the contact pads;
forming a first redistribution structure over the first device and first encapsulant, the first redistribution structure embedding the second device in one or more layers of the first redistribution structure;
providing a prepared substrate; and
attaching the prepared substrate to the first redistribution structure opposite the second device.

9. The method of claim 8, further comprising:
removing the carrier substrate; and
singulating a first package from a second package, the first package including the first device and the prepared substrate, wherein dimensions of the prepared substrate is the same before and after singulation.

10. The method of claim 9, further comprising:
laterally encapsulating the prepared substrate in a third encapsulant; and
forming connectors over the prepared substrate, wherein after singulation the third encapsulant covers sidewalls of the prepared substrate.

11. The method of claim 8, wherein the second device is within lateral extents of the first device.

12. The method of claim 8, wherein the second device is a voltage regulator, the voltage regulator having an output pin which is electrically routed directly to the first device.

13. The method of claim 8, wherein exposing the contact pads of the first device comprises, planarizing the second encapsulant to level upper surfaces of the contact pads with an upper surface of the second encapsulant, the second encapsulant remaining laterally surrounding the contact pads.

14. A method comprising:
encapsulating a first device package with a first encapsulant, the first encapsulant laterally encapsulating the first device package and extending over a front side of the first device package, the first device package including a fan-out structure over an embedded die;

planarizing the first encapsulant to expose contact pads of the fan-out structure of the first device package, a portion of the first encapsulant remaining laterally surrounding the contact pads;

attaching a second device to the first device package by the contact pads of the first device package; and forming a first redistribution structure over the second device, the first redistribution structure extending along an upper surface of the first encapsulant beyond lateral extents of the first device package, the first redistribution structure embedding the second device within one or more layers of the first redistribution structure.

15. The method of claim 14, wherein the second device has an upper surface which is level with an upper surface of a via of the first redistribution structure.

16. The method of claim 14, further comprising:
routing a voltage source signal through the first redistribution structure to the second device;
regulating the voltage source signal into a regulated voltage signal by the second device; and
routing the regulated voltage signal by the contact pads of the first device package to an embedded device of the first device package.

17. The method of claim 14, further comprising:
attaching a substrate to the first redistribution structure, the substrate having a smaller foot print than the first redistribution structure;
attaching connectors to the front side of the substrate; and
singulating a second device package, the second device package including the substrate, the first device package, and a portion of the first redistribution structure.

18. The method of claim 17, further comprising:
prior to attaching connectors to the front side of the substrate, encapsulating the substrate with a second encapsulant, the second encapsulant laterally encapsulating the substrate and extending over a front side of the substrate; and
planarizing the second encapsulant to expose contact pads of the substrate.

19. The method of claim 18, wherein a portion of the second encapsulant remains between the contact pads of the substrate.

20. The method of claim 18, wherein the second device package has sidewalls comprising the first encapsulant, the second encapsulant, and dielectric material of the first redistribution structure.

* * * * *